United States Patent
Woo et al.

(10) Patent No.: US 11,449,274 B2
(45) Date of Patent: Sep. 20, 2022

(54) MEMORY DEVICE, DATA OUTPUTTING METHOD THEREOF, AND MEMORY SYSTEM HAVING THE SAME

(71) Applicant: SAMSUNG ELECTRONICS CO., LTD., Suwon-si (KR)

(72) Inventors: Byungsuk Woo, Hwaseong-si (KR); Changkyu Seol, Osan-si (KR); Sucheol Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/356,687

(22) Filed: Jun. 24, 2021

(65) Prior Publication Data

US 2022/0188013 A1 Jun. 16, 2022

(30) Foreign Application Priority Data

Dec. 11, 2020 (KR) .................. 10-2020-0173059

(51) Int. Cl.
*G06F 3/06* (2006.01)

(52) U.S. Cl.
CPC .......... *G06F 3/0655* (2013.01); *G06F 3/0619* (2013.01); *G06F 3/0679* (2013.01)

(58) Field of Classification Search
CPC ..... G06F 3/0655; G06F 3/0619; G06F 3/0679
See application file for complete search history.

(56) References Cited

U.S. PATENT DOCUMENTS

| | | | |
|---|---|---|---|
| 6,763,495 B2 | 7/2004 | Suzuki et al. | |
| 6,938,197 B2 | 8/2005 | Doubler et al. | |
| 8,700,971 B2 | 4/2014 | Motozuka | |
| 2006/0195762 A1 | 8/2006 | Back | |
| 2007/0080409 A1* | 4/2007 | Seliskar | H01L 21/823487 257/E21.643 |
| 2009/0235113 A1 | 9/2009 | Shaeffer et al. | |
| 2012/0173952 A1 | 7/2012 | Kumar K. et al. | |
| 2022/0019383 A1* | 1/2022 | Zhu | G06F 11/1004 |

* cited by examiner

*Primary Examiner* — Hiep T Nguyen
(74) *Attorney, Agent, or Firm* — Lee IP Law, P.C.

(57) ABSTRACT

A memory device includes: a memory cell array; a data selector configured to receive data from the memory cell array, and to output the received data as first sub-data and second sub-data; a cyclic redundancy check (CRC) generator configured to generate first CRC values corresponding to the first sub-data, and to generate second CRC values corresponding to the second sub-data; a CRC selector configured to determine an order of the first CRC values and the second CRC values, and to output one of the first CRC values and one of the second CRC values according to the determined order; and a transmitter configured to receive the first CRC values and the second CRC values according to the determined order, and to transmit CRC values of the data by a multilevel signaling method.

20 Claims, 18 Drawing Sheets

| | PIN | BL0 | BL1 | BL2 | BL3 | BL4 | BL5 | BL6 | BL7 |
|---|---|---|---|---|---|---|---|---|---|
| MSB | DQ0 | 0 | 1 | 2 | 3 | 4 | 5 | 6 | 7 |
| MSB | DQ1 | 8 | 9 | 10 | 11 | 12 | 13 | 14 | 15 |
| MSB | DQ2 | 16 | 17 | 18 | 19 | 20 | 21 | 22 | 23 |
| MSB | DQ3 | 24 | 25 | 26 | 27 | 28 | 29 | 30 | 31 |
| MSB | DQ4 | 32 | 33 | 34 | 35 | 36 | 37 | 38 | 39 |
| MSB | DQ5 | 40 | 41 | 42 | 43 | 44 | 45 | 46 | 47 |
| MSB | DQ6 | 48 | 49 | 50 | 51 | 52 | 53 | 54 | 55 |
| MSB | DQ7 | 56 | 57 | 58 | 59 | 60 | 61 | 62 | 63 |
| MSB | DBI | 64 | 65 | 66 | 67 | 68 | 69 | 70 | 71 |
| LSB | DQ0 | 72 | 73 | 74 | 75 | 76 | 77 | 78 | 79 |
| LSB | DQ1 | 80 | 81 | 82 | 83 | 84 | 85 | 86 | 87 |
| LSB | DQ2 | 88 | 89 | 90 | 91 | 92 | 93 | 94 | 95 |
| LSB | DQ3 | 96 | 97 | 98 | 99 | 100 | 101 | 102 | 103 |
| LSB | DQ4 | 104 | 105 | 106 | 107 | 108 | 109 | 110 | 111 |
| LSB | DQ5 | 112 | 113 | 114 | 115 | 116 | 117 | 118 | 119 |
| LSB | DQ6 | 120 | 121 | 122 | 123 | 124 | 125 | 126 | 127 |
| LSB | DQ7 | 128 | 129 | 130 | 131 | 132 | 133 | 134 | 135 |
| LSB | DBI | 136 | 137 | 138 | 139 | 140 | 141 | 142 | 143 |
| MSB | CRC | 0 | 1 | 2 | 3 | 4 | 5 | 6 | 7 |
| LSB | CRC | 0 | 1 | 2 | 3 | 4 | 5 | 6 | 7 |

1st Sub DATA

2nd Sub DATA

FIG. 8

MEMORY DEVICE, DATA OUTPUTTING METHOD THEREOF, AND MEMORY SYSTEM HAVING THE SAME

CROSS-REFERENCE TO RELATED APPLICATION

Korean Patent Application No. 10-2020-0173059, filed on Dec. 11, 2020, in the Korean Intellectual Property Office, and entitled: "Memory Device, Data Outputting Method thereof, and Memory System Having the Same," is incorporated by reference herein in its entirety.

BACKGROUND

1. Field

Embodiments relate to a memory device, a data output method thereof, and a memory system having the same.

2. Description of the Related Art

In general, a demand for high-capacity and high-speed data transmission is increasing with the rapid supply of mobile devices and a rapid increase in the amount of Internet access.

SUMMARY

Embodiments are directed to a memory device, including: a memory cell array; a data selector configured to receive data from the memory cell array, and to output the received data as first sub-data and second sub-data; a cyclic redundancy check (CRC) generator configured to generate first CRC values corresponding to the first sub-data, and to generate second CRC values corresponding to the second sub-data; a CRC selector configured to determine an order of the first CRC values and the second CRC values, and to output one of the first CRC values and one of the second CRC values according to the determined order; and a transmitter configured to receive the first CRC values and the second CRC values according to the determined order, and to transmit CRC values of the data by a multilevel signaling method.

Embodiments are also directed to a memory device, including: a memory cell array; a plurality of transceivers configured to transmit/receive data of the memory cell array through data lines by a multilevel signaling method; a data bus inversion (DBI) transceiver configured to transmit/receive DBI data by the multilevel signaling method through a data bus inversion line; and a cyclic redundancy check (CRC) transceiver configured to transmit/receive CRC values of the data by the multilevel signaling method through an error detection check (EDC) line. The memory device may be configured to separate the data into a plurality of sub-data, generate the CRC values corresponding to each of the plurality of sub-data, and order the CRC values, and the CRC transceiver may include a transmitter configured to transmit the ordered CRC values by the multilevel signaling method.

Embodiments are also directed to a data output method of a memory device, the method including: separating data that is read from a memory cell array into a plurality of sub-data; calculating cyclic redundancy check (CRC) values corresponding to the plurality of sub-data, respectively; ordering the calculated CRC values; and transmitting the ordered CRC values along with the data by a multilevel signaling method.

Example embodiments are also directed to a memory system, including: a memory device; and a controller configured to control the memory device, the controller including: a plurality of transceivers configured to transmit/receive data of the memory device through data lines by a multilevel signaling method; a data bus inversion (DBI) transceiver configured to transmit/receive DBI data by the multilevel signaling method through a data bus inversion line; and a cyclic redundancy check (CRC) transceiver configured to transmit/receive CRC values of the data by the multilevel signaling method through an error detection check (EDC) line.

BRIEF DESCRIPTION OF DRAWINGS

Features will become apparent to those of skill in the art by describing in detail example embodiments with reference to the attached drawings in which:

FIG. 8 is a diagram illustrating, by way of example, a CRC encoding method according to a data selection method according to an example embodiment;

DETAILED DESCRIPTION

A memory device according to an example embodiment and a data output method thereof may calculate cyclic redundancy check (CRC) by mapping cell data to an input of a parallel CRC calculator according to setting of a memory register, order each output of the parallel CRC calculator, and transmit the ordered output to a transmitter in multilevel signaling method, thereby calculating the CRC with low latency while maintaining a code rate.

Figure 1:
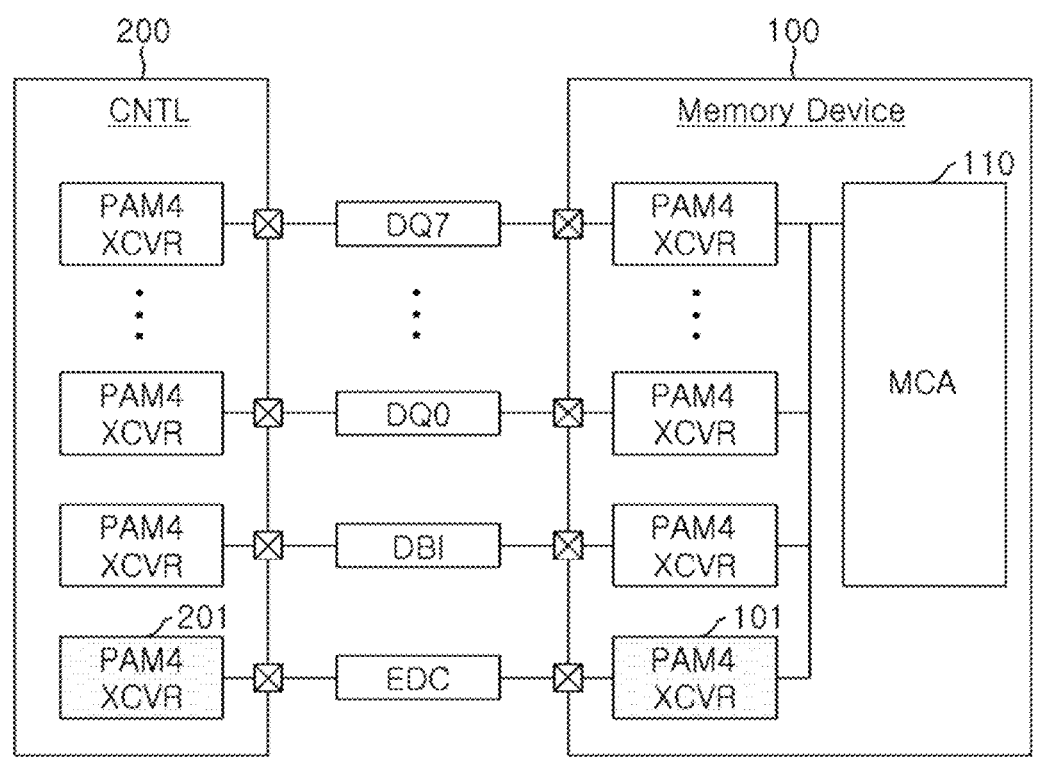
FIG. 1 is a diagram illustrating, by way of example, a memory system 10 according to an example embodiment.

FIG. 1 is a diagram illustrating, by way of example, a memory system 10 according to an example embodiment.

Referring to FIG. 1, the memory system 10 may include a memory device 100 and a controller 200. The memory system 10 may be implemented as a multi chip package (MCP) or a system on chip (SoC).

The memory device 100 may be implemented to store data received from the controller 200 or to output the read data to the controller 200. The memory device 100 may be used as an operation memory, a working memory, or a buffer memory in a computing system. In an example embodiment, the memory device 100 may be implemented as a single in-line memory module (SIMM), a dual in-line memory module (DIMM), a small-outline DIMM (SODIMM), an unbuffered MINIM (UDIMM), a fully-buffered DIMM (FB-DIMM), a rank-buffered DIMM (RBDIMM), a mini-DIMM, a micro-DIMM, a registered DIMM (RDIMM), or a load-reduced DIMM (LRDIMM).

In an example embodiment, the memory device 100 may be implemented as a volatile memory. For example, the volatile memory may include at least one of a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a Rambus DRAM (RDRAM), and a static RAM (SRAM). In another example embodiment, the memory device 100 may be implemented as a non-volatile memory. For example, the nonvolatile memory may include one of a NAND flash memory, a phase-change RAM (PRAM), a magneto-resistive RAM (MRAM), a resistive RAM (ReRAM), a ferroelectric RAM (FRAM), and a NOR flash memory.

Although not illustrated, the memory device 100 may include a serial presence detect (SPD) chip. The SPD chip may be implemented to store information on characteristics of the memory device 100. In an example embodiment, the SPD chip may store memory device information such as a module type, operating environment, line arrangement, module configuration, and storage capacity of the memory device 100. In an example embodiment, the SPD chip may include a programmable read-only memory, for example, an electrically erasable programmable read only memory (EE-PROM) or the like.

The memory device 100 may include a memory cell array 110 (MCA) and a plurality of transceivers (PAM4 XCVR) 101.

Each of the plurality of transceivers may be implemented to transmit and receive (transmit/receive) data according to a pulse amplitude modulation 4-level (PAM4) signaling method through data lines DQ0 to DQ7, data bus inversion (DBI) lines, and error detection code (EDC) lines. Meanwhile, although the number of data lines illustrated in FIG. 1 is eight, it should be understood that the number of data lines is not limited thereto. Meanwhile, although the transmission signaling method described in connection with FIG. 1 is PAM4, it should be understood that embodiments are not limited to the PAM4, and may be applied to PAM8, PAM16, etc.

The controller 200 may be implemented to control the memory device 100. The controller 200 may know a transmission signaling mode stored in the memory device 100. The controller 200 may transmit and receive data to and from the memory device 100 through a data channel according to the transmission signaling mode.

The controller 200 may include a plurality of transceivers 201. Each of the transceivers may include a transmitter and a receiver. The transmitter of the controller 200 may be implemented to transmit write data to the memory device 100 through the data lines DQ0 to DQ7 according to the transmission signaling method. The receiver of the controller 200 may be implemented to receive read data to the memory device 100 through the data lines DQ0 to DQ7 according to the transmission signaling method.

In an example embodiment, the controller 200 may be configured as a separate chip or may be integrated with the memory device 100. For example, the controller 200 may be implemented on a mother board. In addition, the controller 200 may be implemented as an integrated memory controller (IMC) included in a microprocessor. In addition, the controller 200 may be located in an input/output hub. The input/output hub including the controller 200 may be referred to as a memory controller hub (MCH).

In general, when an I/O interface speed (data frequency) increases due to PAM4 signaling, a core speed of the memory device (e.g., DRAM) may increase or the number of pre-fetch bits may increase. The error check efficiency may decrease due to the increase in the number of pre-fetch bits and the change in the code rate (ratio of data bit and check bit). In addition, as data increases, the latency for the CRC calculation may increase, and thus, the system performance may deteriorate. Therefore, a CRC encoding method that reduces latency while maintaining a code rate in PAM4 signaling is desirable.

The memory system 10 according to the present example embodiment may separate cell data according to the PAM4 signaling, perform the CRC calculation in parallel according to the separated cell data, and transmit the output of the parallel CRC in multilevel signaling method, which may reduce the latency of the CRC calculation while maintaining the code rate.

Figure 2A:
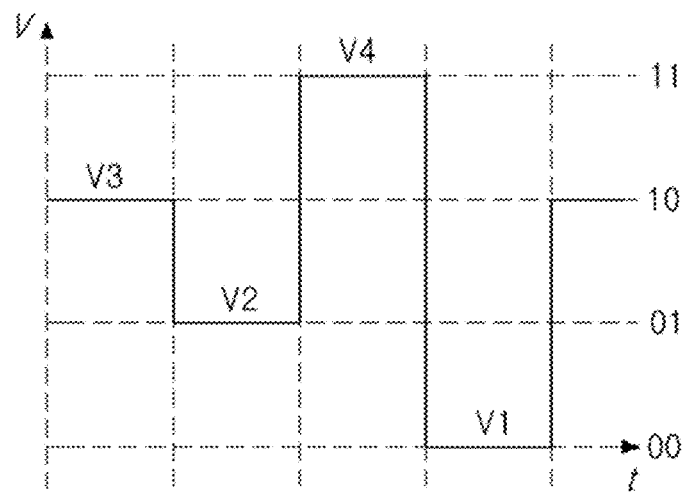
FIG. 2A is a diagram illustrating, by way of example, PAM4 signaling according to an example embodiment.
Figure 2B:
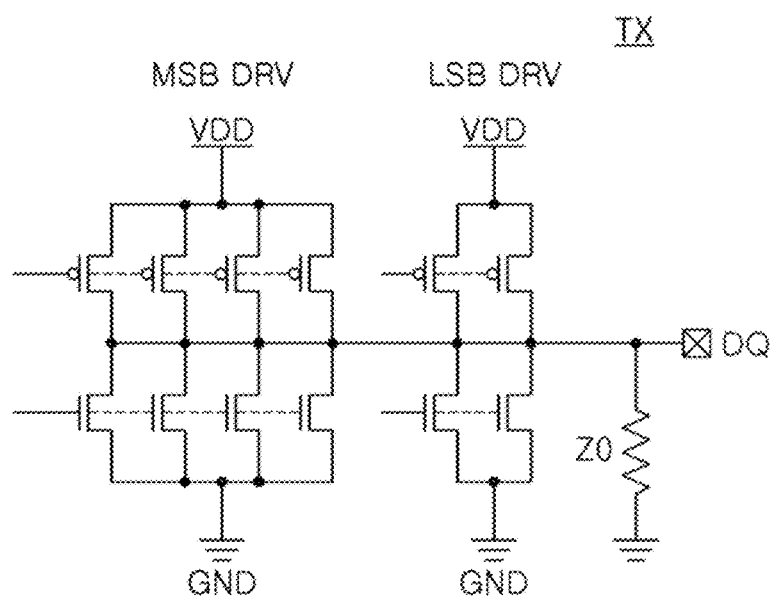
FIG. 2B is a diagram illustrating, by way of example, a transmitter TX of a transceiver according to an example embodiment.
Figure 2C:
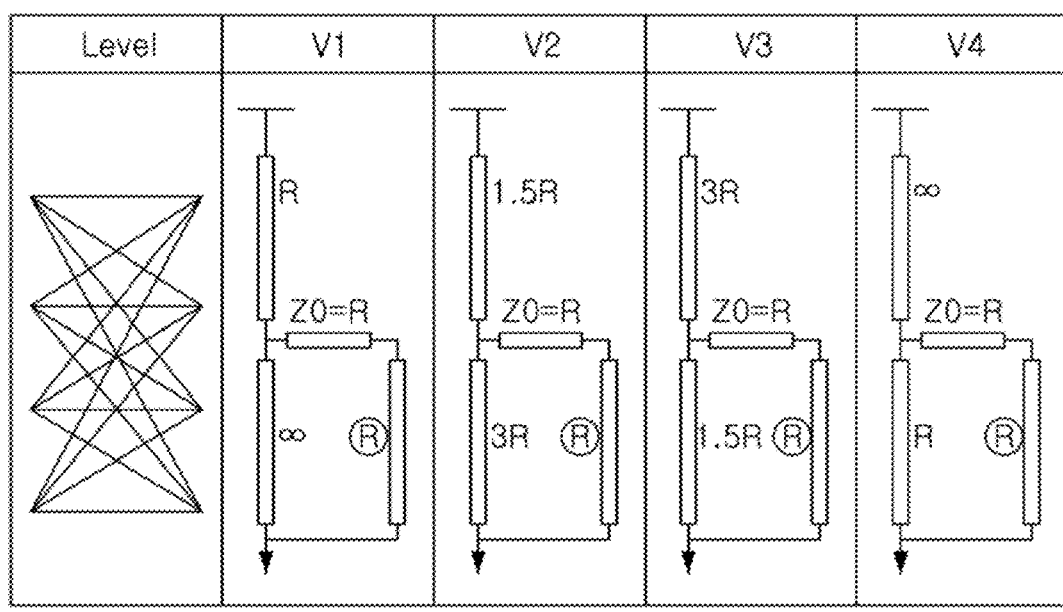
FIG. 2C is a diagram illustrating signal levels transmitted by a transmitter (TX) by way of example.

FIG. 2A is a diagram illustrating, by way of example, PAM4 signaling according to an example embodiment, FIG. 2B is a diagram illustrating, by way of example, a transmitter TX of a transceiver according to an example embodiment, and FIG. 2C is a diagram illustrating signal levels transmitted by a transmitter (TX) by way of example.

Referring to FIG. 2A, 2-bit data '00', '01', '10', and '11' corresponding to four voltage levels V1 to V4 may be transmitted according to the PAM4 signaling. Referring to FIG. 2B, 1-bit data '1' and '0' corresponding to two voltage levels VL and VH may be transmitted according to the NRZ (non-return-to-zero) transmission signaling.

FIG. 2B is a diagram illustrating, by way of example, a transmitter (TX) of a transceiver 101 according to the present example embodiment.

Referring to FIG. 2B, the transmitter TX may include a most significant bit (MSB) driver (pull-up/pull-down driver; MSB DRV) and a least significant bit (LSB) driver (pull-up/pull-down driver; LSB DRV) connected to a DQ pad (data pad). The MSB driver may include a plurality of P-channel metal-oxide-semiconductor (PMOS) transistors connected in parallel between a power supply terminal (VDD) and the DQ pad, and a plurality of N-channel metal-oxide-semiconductor (NMOS) transistors connected in parallel between the DQ pad and a ground terminal (GND). The LSB driver may include a plurality of PMOS transistors connected in parallel between the power terminal VDD and the DQ pad, and a plurality of NMOS transistors connected in parallel between the DQ pad and the ground terminal GND.

FIG. 2C is a diagram illustrating signal levels V1 to V4 according to pull-up/pull-down drive resistances of the transmitter TX by way of example. Referring to FIG. 2C, when the pull-up resistance is R and the pull-down resistance is infinite, the first signal level V1 may correspond; when the pull-up resistance is 1.5 R and the pull-down resistance is 3 R, the second signal level V2 may correspond; when the pull-up resistance is 3 R and the pull-down resistance is 1.5 R, the third signal level V3 may correspond; and when the pull-up resistance is infinite and the pull-down resistance is R, the fourth signal level V4 may correspond. Here, R may be a resistance value corresponding to a characteristic impedance ZO. In an example embodiment, R may be the same according to the channel. In another example embodiment, R may be different according to the channel. It should be understood that the relationship between the signal level and the resistance is not limited to FIG. 2C.

Figure 3:
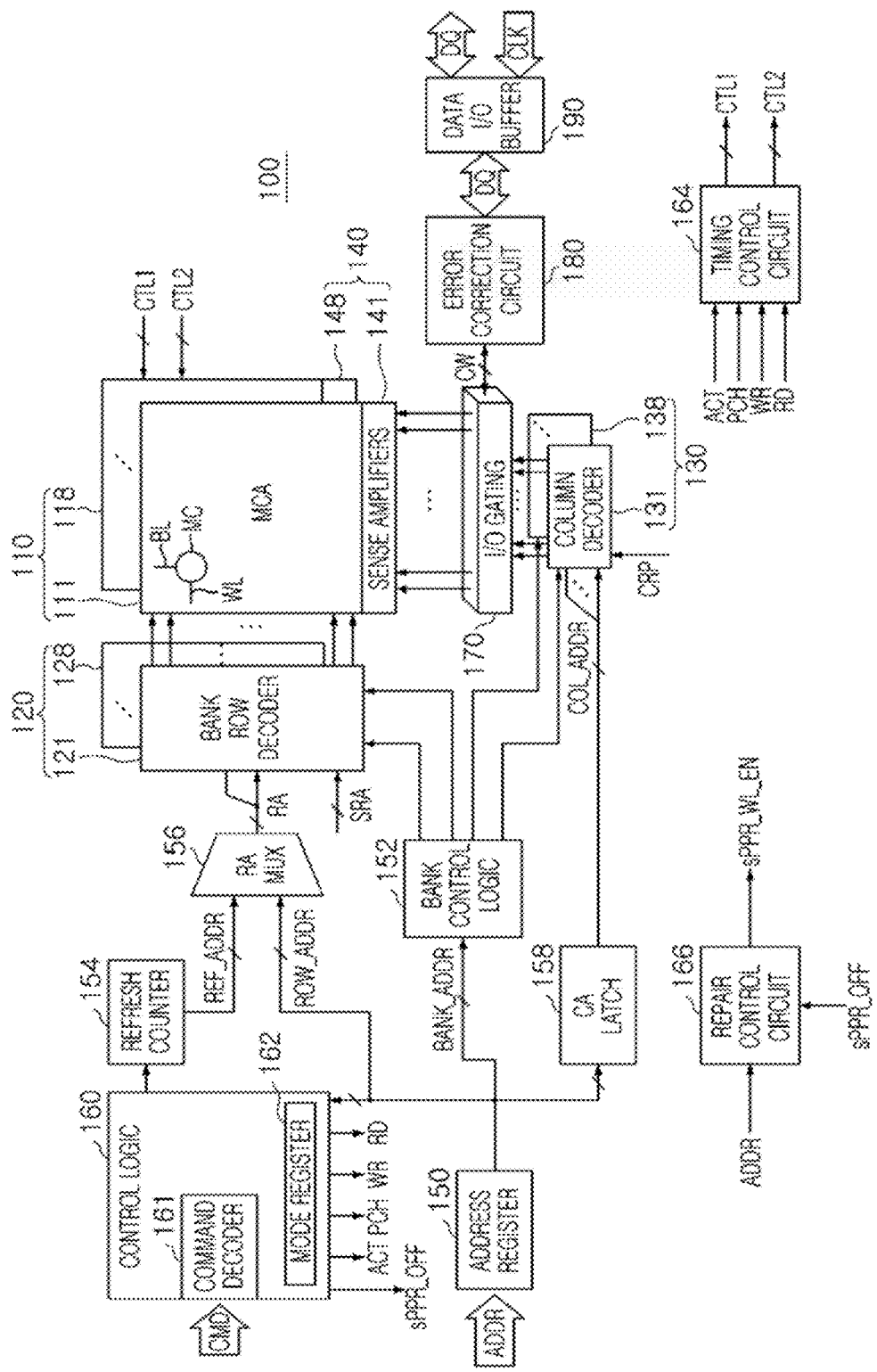
FIG. 3 is a diagram illustrating, by way of example, a memory device 100 according to an example embodiment.

FIG. 3 is a diagram illustrating, by way of example, a memory device 100 according to an example embodiment.

Referring to FIG. 3, the memory device 100 may include a memory cell array 110, a row decoder 120, a column decoder 130, a sense amplifier circuit 140, an address register 150, a bank control logic 152, a refresh counter 154, a row address multiplexer 156, a column address latch 158, a control logic 160, a repair control circuit 166, a timing control circuit 164, an input/output gating circuit 170, an error correction circuit 180, and a data input/output circuit 190.

The memory cell array 110 may include first to eighth banks 111 to 118. It should be understood that the number of banks of the memory cell array 110 is not limited thereto.

For the first to eighth banks 111 to 118, first to eighth bank row decoders 121 to 128, first to eighth bank column decoders 131 to 138, and first to eighth bank sense amplifiers 141 to 148 may be associated therewith, respectively. Each of the first to eighth banks 111 to 118 may include a plurality of memory cells MCs formed at a point where word lines WL and bit lines BL intersect.

The row decoder 120 may include the first to eighth bank row decoders 121 to 128 connected to the first to eighth banks 111 to 118, respectively.

The column decoder 130 may include the first to eighth bank column decoders 131 to 138 connected to the first to eighth banks 111 to 118, respectively.

The sense amplifier circuit 140 may include the first to eighth bank sense amplifiers 141 to 148 connected to the first to eighth banks 111 to 118, respectively.

The address register 150 may receive and store an address ADDR (having a bank address BANK_ADDR, a row address ROW_ADDR, and a column address COL_ADDR) from an external memory controller. The address register 150 may provide the received bank address BANK_ADDR to the bank control logic 152, provide the received row address ROW_ADDR to the row address multiplexer 156, and provide the received column address COL_ADDR to the column address latch 158.

The bank control logic 152 may generate bank control signals in response to the bank address BANK_ADDR. In response to the bank control signals, the bank row decoder corresponding to the bank address BANK_ADDR among the first to eighth bank row decoders 121 to 128 may be activated. In response to the bank control signals, the bank column decoder corresponding to the bank address BANK_ADDR among the first to eighth bank column decoders 131 to 138 may be activated.

The row address multiplexer 156 may receive a row address ROW_ADDR from the address register 150 and receive a refresh row address REF ADDR from the refresh counter 154. The row address multiplexer 156 may selectively output the row address ROW_ADDR or the refresh row address REF ADDR as a row address RA. The row address RA output from the row address multiplexer 156 may be applied to the first to eighth bank row decoders 121 to 128, respectively.

The bank row decoder activated by the bank control logic 152 among the first to eighth bank row decoders 121 to 128 may decode the row address RA output from the row address multiplexer 156, and activate the word line corresponding to the row address. For example, the activated bank row decoder may apply a word line driving voltage to the word line corresponding to the row address. The activated bank row decoder may activate a redundancy word line corresponding to a redundancy row address output from the repair control circuit 166 simultaneously with activating the word line corresponding to the row address.

The column address latch 158 may receive the column address COL_ADDR from the address register 150 and temporarily store the received column address COL_ADDR. The column address latch 158 may gradually increase the received column address COL_ADDR in a burst mode. The column address latch 158 may apply a temporarily stored or gradually increased column address COL_ADDR to the first to eighth bank column decoders 131 to 138, respectively.

Among the first to eighth bank column decoders 131 to 138, the bank column decoder activated by the bank control logic 152 may activate the sense amplifier corresponding to the bank address BANK_ADDR and the column address COL_ADDR through the input/output gating circuit 170. The activated bank column decoder may perform a column repair operation in response to a column repair signal CRP output from the repair control circuit 166.

The control logic 160 may be implemented to control the operation of the memory device 100. For example, the control logic 160 may generate control signals so that the memory device 100 performs a write operation or a read operation. The control logic 160 may include a command decoder 161 for decoding a command CMD received from the memory controller, and may include a mode register set 162 for setting an operation mode of the memory device 100.

For example, the command decoder 161 may decode a write enable signal (/WE), a row address strobe signal (/RAS), a column address strobe signal (/CAS), a chip select signal (/CS), etc., thereby generating operation control signals ACT, PCH, WE, and RD corresponding to the command CMD. The control logic 160 may provide the operation control signals ACT, PCH, WE, and RD to the timing control circuit 164. The control signals ACT, PCH, WR, and RD may include an active signal ACT, a precharge signal PCH, a write signal WR, and a read signal RD. The timing control circuit 164 may generate first control signals CTL1 for controlling a voltage level of the word line WL and generate second control signals CTL2 for controlling a voltage level of the bit line BL in response to the operation control signals ACT, PCH, WR, and RD, and provide the first control signals CTL1 and the second control signals CTL2 to the memory cell array 110.

The repair control circuit 166 may generate repair control signals CRP and SRP for controlling a repair operation of at least one of a first cell area and a second cell area of the banks based on the row address ROW_ADDR of the address (ADDR or access address), the column address COL_ADDR, and fuse information of each of the word lines. The repair control circuit 166 may provide the redundancy row address to the corresponding bank row decoder, provide the column repair signal CRP to the corresponding bank column decoder, and provide the selection signal and an enable signal SRA to a block control circuit related to the corresponding redundancy array block.

In an hPPR mode stored in the mode register set 163, the repair control circuit 166 may generate an hPPR word line activation signal in response to the address ADDR. In an sPPR mode stored in the mode register set 163, the repair control circuit 166 may generate an sPPR word line activation signal sPPR_WL_EN in response to the address ADDR. In an sPPR OFF mode stored in the mode register set 162, the repair control circuit 166 may turn off an sPPR logic and generate a normal word line activation signal to access previous data. In an example embodiment, the repair control circuit 166 may change a repair unit based on the address ADDR and the fuse information. For example, the repair control circuit 166 may change the type and number of repair address bits for the address ADDR and the fuse information.

Each of the input/output gating circuits of the input/output gating circuit 170 may include an input data mask logic, read data latches for storing data output from the first to eighth banks 111 to 118, and write drivers for writing data to the first to eighth banks 111 to 118, along with circuits for gating input/output data.

A codeword (CW) to be read from one of the first to eighth banks 111 to 118 may be sensed by a sense amplifier corresponding to one bank and may be stored in the read data latches. The codeword CW stored in the read data latches may be provided to the memory controller through the data input/output circuit 190 after ECC decoding is performed by the error correction circuit 180. Data DQ to be written to one of the first to eighth banks 111 to 118 may be written to one bank through the write drivers after ECC encoding is performed by the error correction circuit 180.

The data input/output circuit 190 may provide the data DQ to the error correction circuit 180 based on the clock signal CLK provided from the memory controller in the write operation, and provide, to the memory controller, the data DQ provided from the error correction circuit 180 in the read operation. The data input/output circuit 190 may include a data selector 191 (see FIG. 4) for transmitting and receiving data. In an example embodiment, the data input/output circuit 190 may be implemented to transmit data and CRC values according to the PAM4 signaling method. In an example embodiment, the data input/output circuit 190 may be implemented to receive data and CRC values according to the PAM4 signaling method.

The error correction circuit 180 may generate parity bits based on the data bits of the data DQ provided from the data input/output circuit 190 in the write operation and may provide the codeword CW including the data DQ and the parity bits to the input/output gating circuit 170. The input/output gating circuit 170 may write the codeword CW to the bank.

The error correction circuit 180 may receive the codeword CW read from one bank from the input/output gating circuit 170 in the read operation. The error correction circuit 180 may correct at least one error bit included in the data DQ by performing the ECC decoding on the data DQ using the parity bits included in the read codeword CW, and provide the corrected error bit to the data input/output circuit 190.

Figure 4:
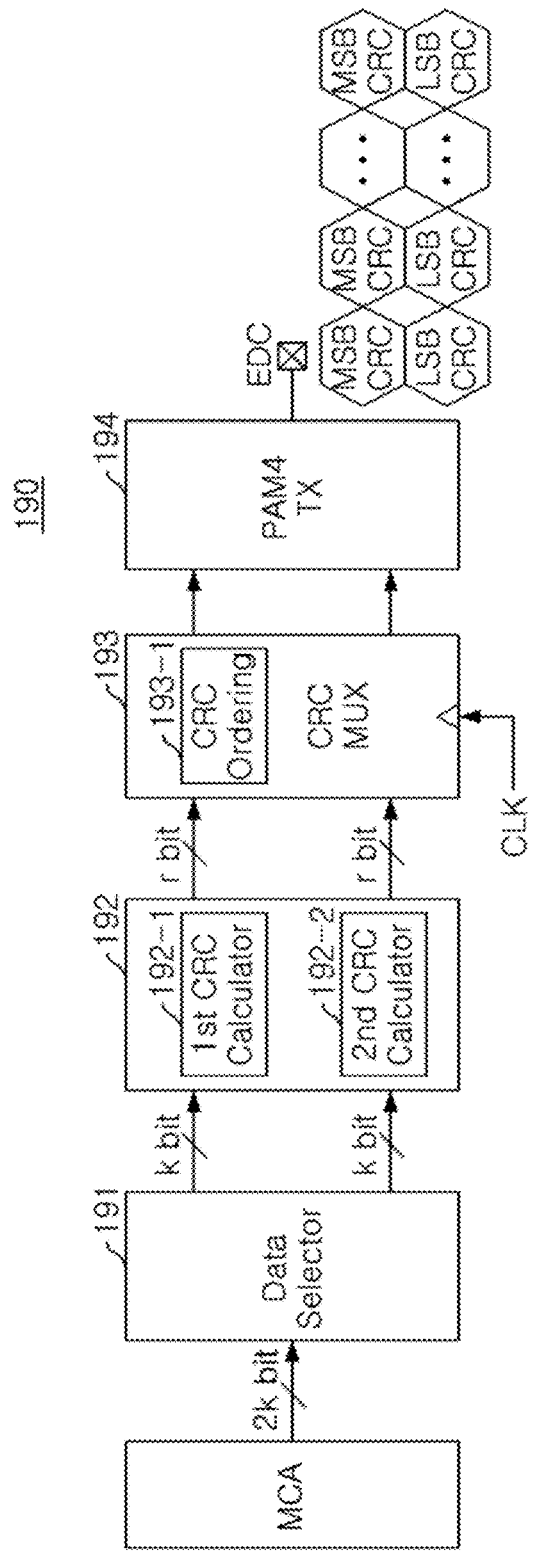
FIG. 4 is a diagram illustrating, by way of example, an output device of a data input/output circuit 190 according to an example embodiment.

FIG. 4 is a diagram illustrating, by way of example, an output device of a data input/output circuit 190 according to an example embodiment. Referring to FIG. 4, an output device of the data input/output circuit 190 may include the data selector 191, a CRC generator 192, a CRC selector 193, and a transmitter 194.

The data selector 191 may receive cell data (e.g., 2k-bit (k is an integer greater than or equal to 2) data) from the memory cell array MCA. The data selector 191 may select the received 2k-bit data as first sub-data of k bits and second sub-data of k bits. In an example embodiment, the data selector 191 may separate the received cell data into separated first and second sub-data according to a setting of a memory register.

The CRC generator 192 may be implemented to receive the first and second sub-data, and to generate a first CRC value and a second CRC value of r bits corresponding to each of the first and second sub-data. The CRC generator 192 may include a first CRC calculator 192-1 and a second CRC calculator 192-2.

The first CRC calculator 192-1 may receive the first sub-data or the inverted first sub-data, and may generate a first CRC value by dividing the first sub-data by a CRC polynomial. In an example embodiment, the first CRC value may be a most significant bit (MSB) CRC value.

The second CRC calculator 192-2 may receive the second sub-data or the inverted second sub-data, and may generate a second CRC value by dividing the second sub-data by the CRC polynomial. In an example embodiment, the first CRC value may be a least significant bit (LSB) CRC value.

The CRC selector 193 may be implemented to receive the first CRC value and the second CRC value, order the first CRC value and the second CRC value, and output the ordered CRC values to the transmitter 194.

The transmitter 194 may be implemented to receive the ordered CRC values, and output CRC data through an EDC pin according to the transmission signaling method (PAM4 method).

When a PAM4 I/O interface is applied to DRAM, the data rate is doubled at the same data transition time, and thus, the amount of data processed by the memory data path is doubled at the same latency. Therefore, the cyclic redundancy check (CRC) calculation latency, which is an error check method that may be used in the DRAM, increases.

When the PAM4 I/O interface is applied, the memory device 100 (that is, the DRAM) may increase cell data to be processed in a single read/write to twice (k bits) compared to the NRZ. In this case, two CRC calculators may be connected in parallel, and the CRC calculation time may be equal to the NRZ by calculating the CRC by k/2 units. Each CRC (r/2) bit output from the two CRC calculators may be serialized and applied from the CRC selector 193 including a CRC ordering circuit 193-1 to MSB/LSB nodes of the PAM4 transmitter 194, and then the DRAM may output CRC information to the host (or controller) as a PAM4 signal. The host may check errors by separating the received PAM4 CRC signal into the MSB/LSB and decoding these MSB/LSB.

Figure 5:
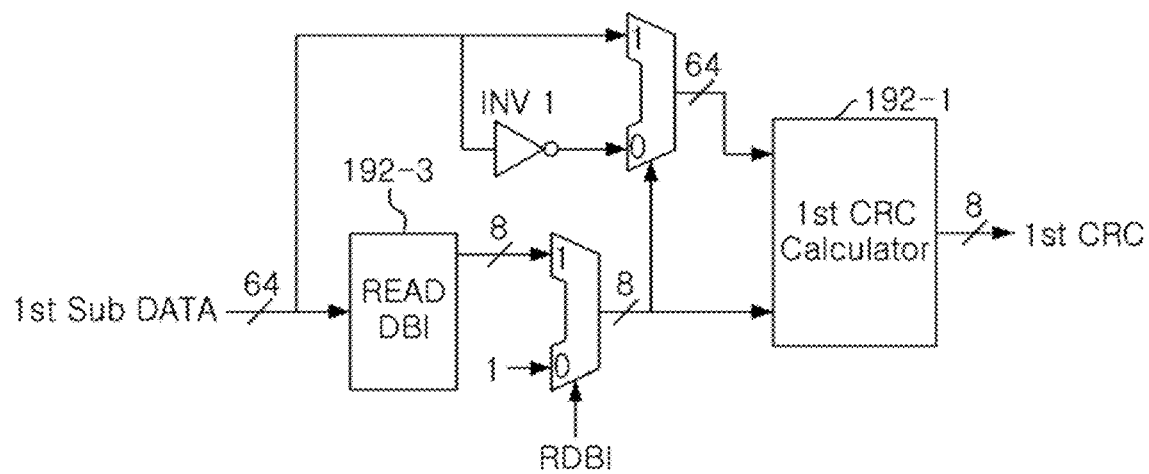
FIG. 5 is a diagram illustrating, by way of example, a CRC generator 192 according to an example embodiment.
Figure 5:
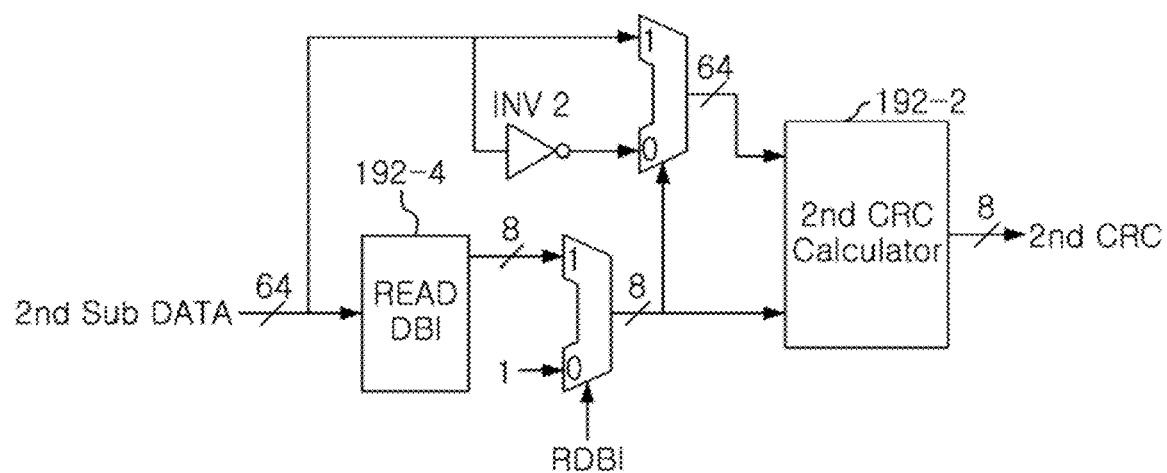

FIG. 5 is a diagram illustrating, by way of example, a CRC generator 192 according to an example embodiment.

Referring to FIG. 5, the CRC generator 192 may include a first CRC calculator 192-1, a second CRC calculator 192-2, a first DBI determiner 192-3, a second DBI determiner 192-4, a first inverter INV1, and a second inverter INV2.

The first CRC calculator 192-1 may be implemented to receive the first sub-data or the inverted first sub-data, and to output the first CRC value corresponding to the first sub-data. The first DBI determiner 192-3 may be implemented to determine whether data is inverted according to the number of 1s in the first sub-data, and to output the first DBI data. The first inverter INV1 may be implemented to invert the first sub-data according to the first DBI data.

In an example embodiment, the first sub-data may be 64 bits, the first DBI data may be 8 bits, and the first CRC value may be 8 bits. It should be understood that the number of bits of the first sub-data, the first DBI data, and the first CRC value is not limited thereto.

The second CRC calculator 192-2 may be implemented to receive the second sub-data or the inverted second sub-data, and to output the second CRC value corresponding to the second sub-data. The second DBI determiner 192-4 may be implemented to determine whether data is inverted according to the number of is in the second sub-data, and to output the second DBI data. The second inverter INV2 may be implemented to invert the second sub-data according to the second DBI data.

In an example embodiment, the second sub-data may be 64 bits, the second DBI data may be 8 bits, and the second CRC value may be 8 bits. It should be understood that the number of bits of the second sub-data, the second DBI data, and the second CRC value is not limited thereto.

Figure 6:
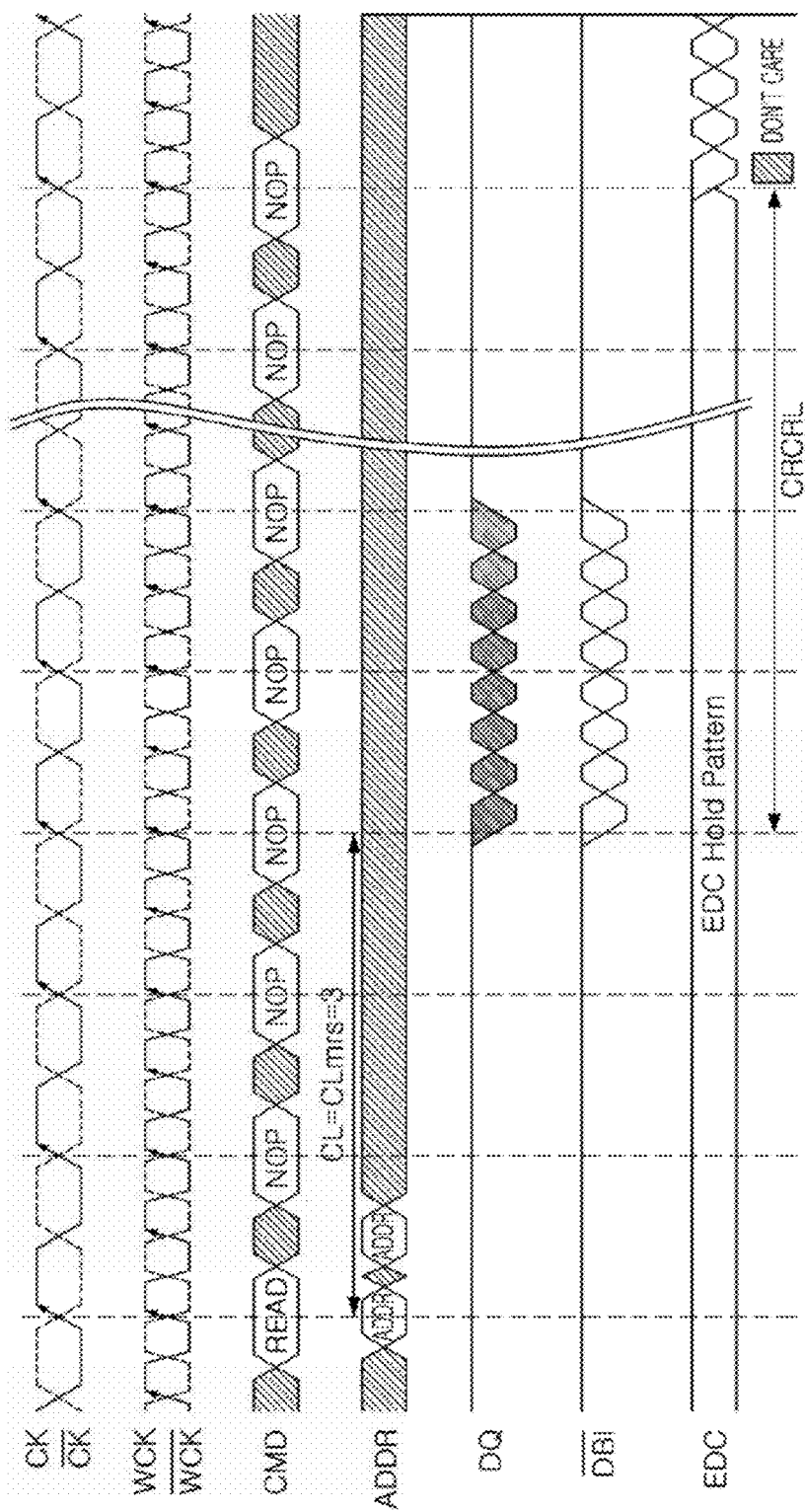
FIG. 6 is a diagram illustrating, by way of example, an output timing of EDC data of the memory device 100 according to the present example embodiment.

FIG. 6 is a diagram illustrating, by way of example, an output timing of EDC data of the memory device 100 according to the present example embodiment.

Referring to FIG. 6, data/DBI data may be transmitted to DQ pins and DBI pins within a predetermined time (e.g., 2CK). During the CRC latency, the CRC values may be calculated, and the calculated CRC values may be transmitted in a multilevel signaling method transmission method. In an example embodiment, the CRC calculation operation may be performed within a predetermined clock after the DQ data is output.

Figure 7:
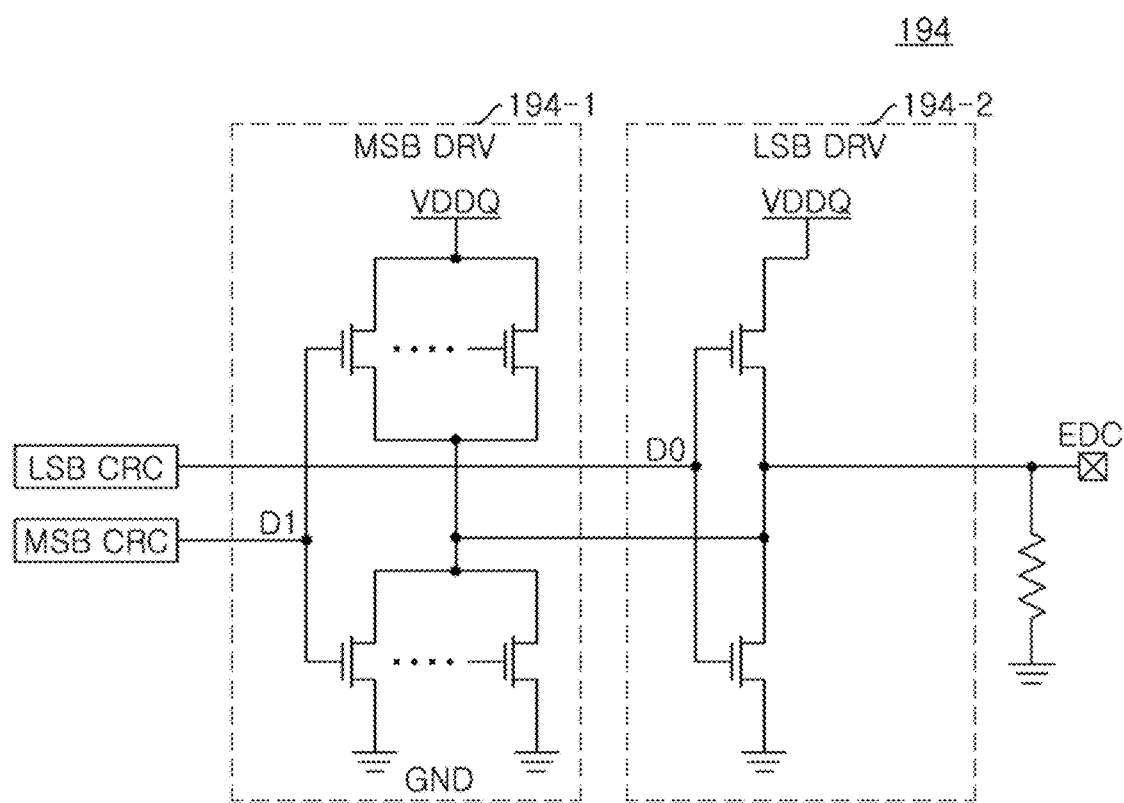
FIG. 7 is a diagram illustrating, by way of example, a transmitter 194 according to an example embodiment.

FIG. 7 is a diagram illustrating, by way of example, a transmitter 194 according to an example embodiment.

Referring to FIG. 7, the transmitter 194 may include an MSB driver 194-1 and an LSB driver 194-2.

The MSB driver 194-1 may include a plurality of pull-up transistors connected between a power terminal VDDQ and an input terminal D1, and a plurality of pull-down transistors connected between the input terminal D1 and a ground terminal GND. An MSB CRC value may be received at the input terminal D1.

The LSB driver 194-2 may include a pull-up transistor connected between the power terminal VDDQ and an input terminal D0, and a pull-down transistor connected between the input terminal D0 and the ground terminal GND. An LSB CRC value may be received at the input terminal D0.

It should be understood that the transmitter 194 described in connection with FIG. 7 is only an example.

FIG. 8 is a diagram illustrating, by way of example, a CRC encoding method according to a data selection method according to an example embodiment.

In general, in the case of a CRC-8, the memory device calculates 72-bit data in a CRC calculator and outputs 8 CRC bits. When the PAM4 method is applied, the CRC calculator input may increase to 144. By dividing the increased 144 input data by half and applying the half of the data to two CRC calculators, the 8 CRC bits may be calculated separately, and the calculated result may be separately applied to the MSB/LSB driver of the PAM4 transmitter by serializing the CRC ordering circuit and the MUX circuit in a predetermined manner. The PAM4 transmitter may produce and output a PAM4 signal by combining each CRC (MSB/LSB).

Using the data selector 191 (see FIG. 4), the MSB data of the read data may be mapped to the first sub-data, and the LSB data of the read data may be mapped to the second sub-data. In an example embodiment, the MSB/LSB data may include the DQ data and the DBI data.

Among the read data, the MSB data and the LSB data may be transmitted to the CRC calculators 192-1 and 192-2, respectively (see FIG. 4).

Each of the CRC calculators 192-1 and 192-2 may calculate CRC using an r-bit polynomial. The outputs of the CRC calculators 192-1 and 192-2 may be serialized after being ordered according to a burst length BL. For example, the output of the first CRC calculator 192-1 may be connected to the MSB driver 194-1 of the transmitter 194 (see FIG. 7). In addition, the output of the second CRC calculator 192-2 may be connected to the LSB driver 194-2 of the transmitter 194.

Thereafter, the transmitter 194 may transmit the outputs of the CRC calculators 192-1 and 192-2 in multilevel signaling method.

The controller 200 (see FIG. 1, or the host) may detect an error by separating the transmitted multilevel data into the MSB/LSB, and decoding the MSB/LSB data in the reverse order.

The CRC encoding method described in connection with FIG. 8 is an example of a method of transmitting each of MSB data and LSB data to a corresponding CRC calculator, and embodiments are not limited thereto.

Figure 9:
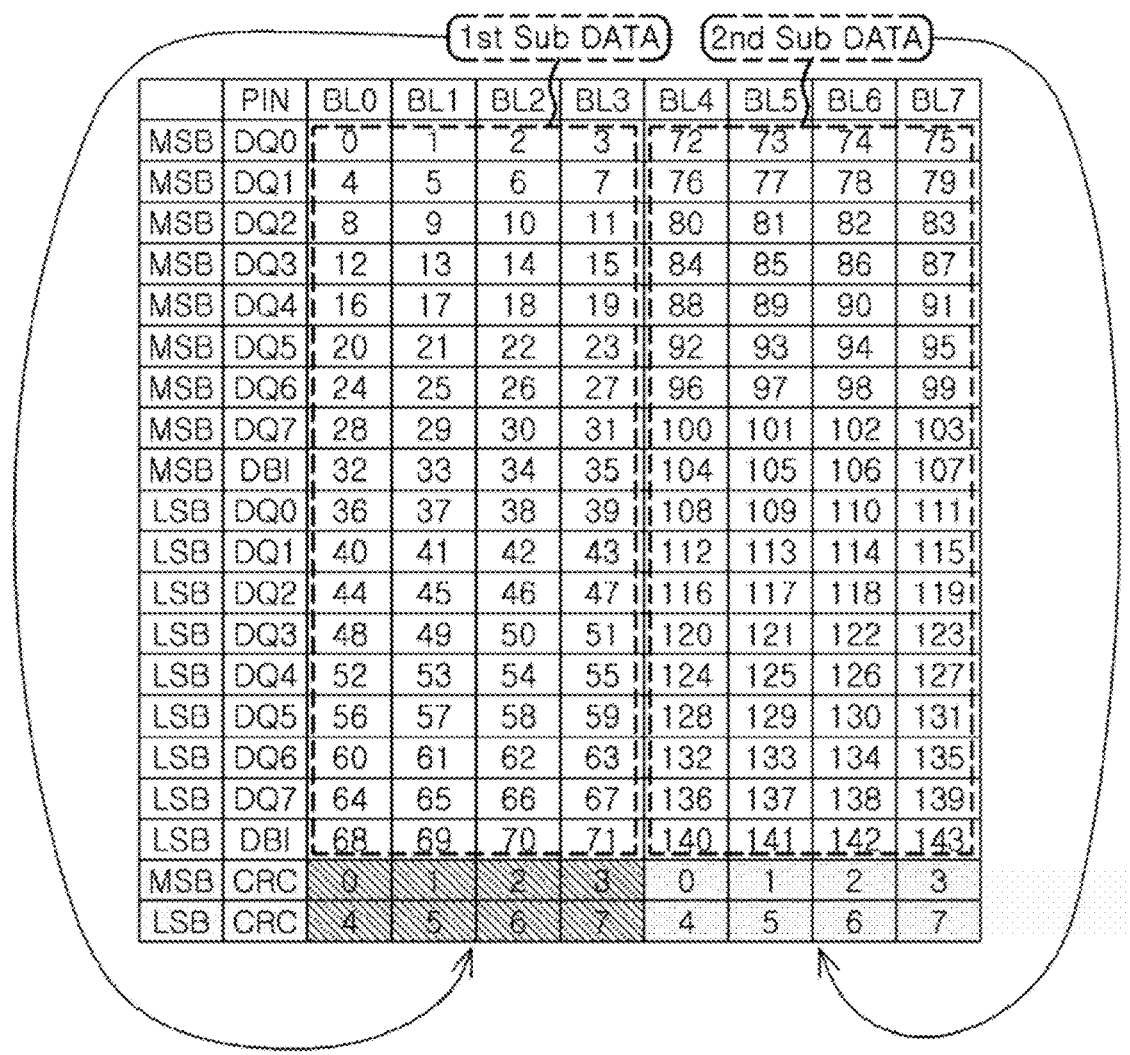
FIG. 9 is a diagram illustrating, by way of example, a CRC encoding method according to a data selection method according to another example embodiment.

FIG. 9 is a diagram illustrating, by way of example, a CRC encoding method according to a data selection method according to another example embodiment.

Referring to FIG. 9, among the read data, the data selector 191 may transmit first half BL data and second half BL data to each of the CRC calculators 192-1 and 192-2 (see FIG. 4).

Each of the CRC calculators 192-1 and 192-4 may calculate CRC using an r-bit polynomial.

The CRC selector 193 (see FIG. 4) may perform the ordering to connect the output of the first CRC calculator 192-1 to the MSB/LSB drivers 194-1 and 194-2 of the transmitter 194 (see FIG. 4) corresponding to four burst lengths BL0 to BL3.

The CRC selector 193 may perform the ordering to connect the output of the second CRC calculator 192-2 to the MSB/LSB drivers 194-1 and 194-2 of the transmitter 194 corresponding to four burst lengths BL4 to BL7.

Thereafter, the transmitter 194 may transmit the outputs of the CRC calculators 192-1 and 192-2 in multilevel signaling method.

The controller 200 (see FIG. 1, or the host) may detect an error by separating the transmitted multilevel data into the MSB/LSB, and decoding the MSB/LSB in the reverse order.

The memory device 100 according to the present example embodiment may selectively operate the CRC encoding method.

Figure 10:
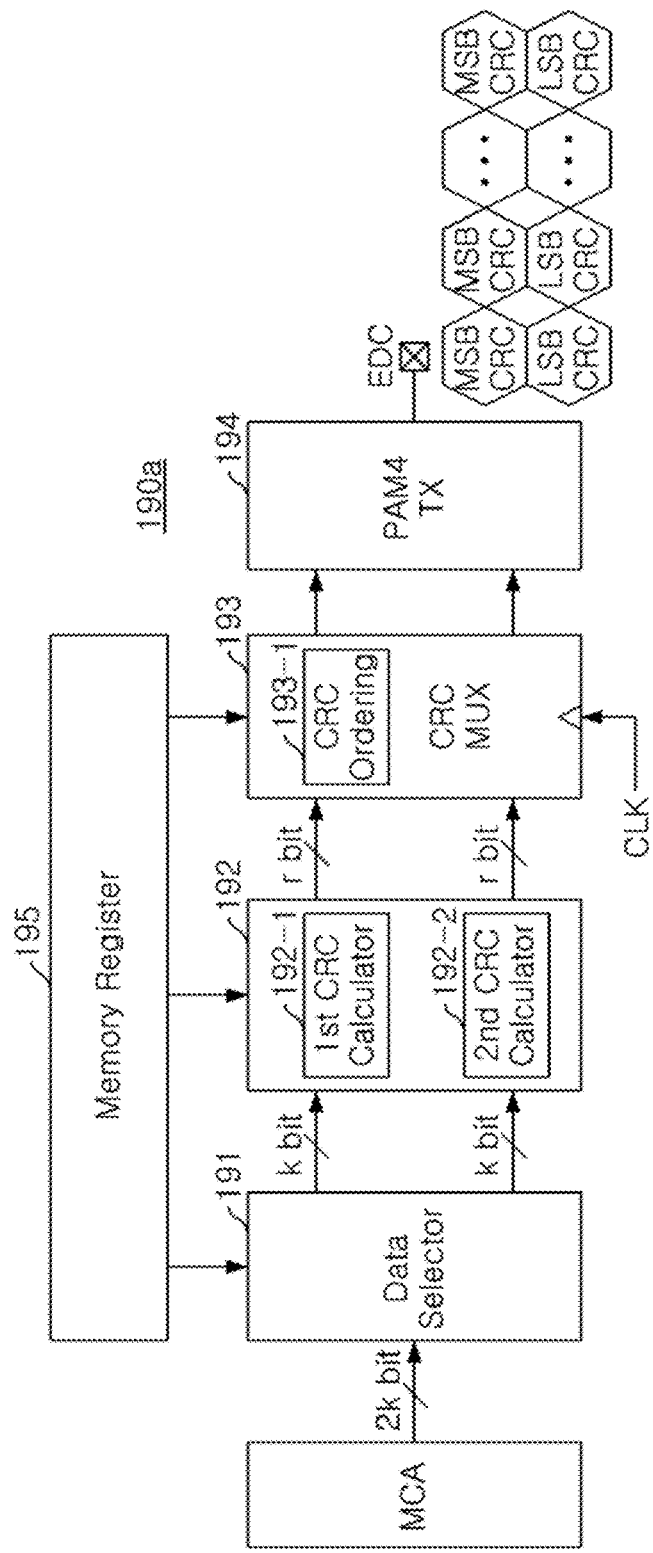
FIG. 10 is a diagram illustrating, by way of example, an output device of a data input/output circuit 190 according to another example embodiment.

FIG. 10 is a diagram illustrating, by way of example, an output device of a data input/output device 190a according to another example embodiment.

Referring to FIG. 10, the data input/output device 190a may further include a memory register 195 compared to that described above in connection with FIG. 4.

The memory register 195 may store mode information for determining the CRC encoding method of the data selector 191, the CRC generator 192, and the CRC selector 193. According to this CRC encoding mode information, it may be determined whether to use the CRC encoding method described in connection with FIG. 8 or whether to use the CRC encoding method described in connection with FIG. 9.

FIGS. 1 to 10 describe CRC generation according to a PAM4 signaling method, but embodiments are not limited thereto.

Figure 11:
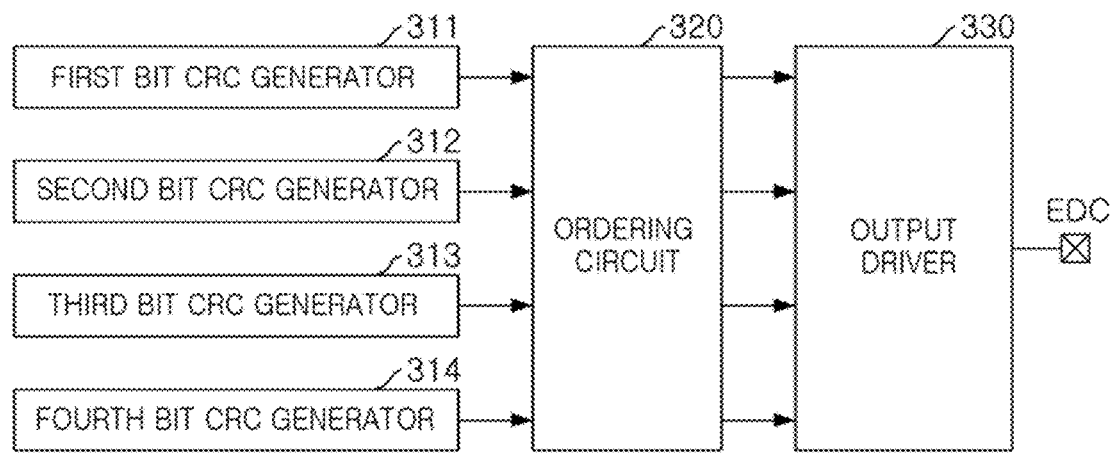
FIG. 11 is a diagram illustrating, by way of example, a data output device 300 according to an example embodiment.

FIG. 11 is a diagram illustrating, by way of example, a data output device 300 according to an example embodiment.

Referring to FIG. 11, the data output device 300 may include a plurality of CRC generators, e.g., first to fourth bit CRC generators 311 to 314, and may include an ordering circuit 320 and an output driver 330.

Each of the first to fourth bit CRC generators 311 to 314 may be implemented to receive the sub-data related to the corresponding CRC bit, and may output the CRC value for the sub-data by the CRC polynomial.

The ordering circuit 320 may order the output values of the first to fourth bit CRC generators 311 to 314, and may transmit the ordered output values to the output driver 330.

The output driver 330 may be implemented to receive the ordered output values, and to transmit the received ordered output values in multilevel signaling method. In an example embodiment, the multilevel may be an 8-level.

Figure 12:
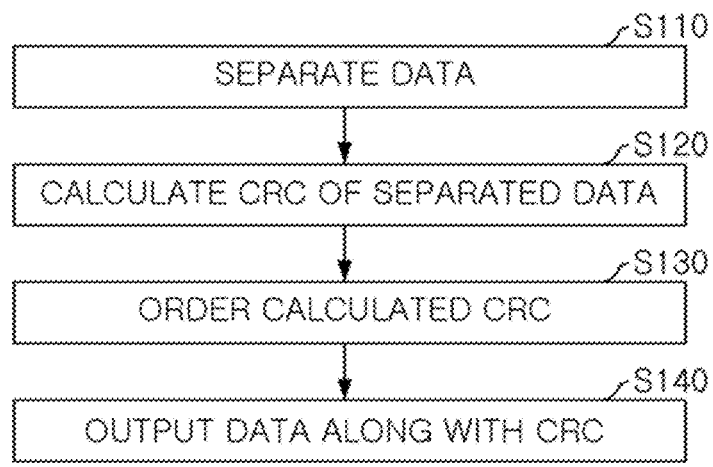
FIG. 12 is a flowchart illustrating, by way of example, a data output method of a memory device 100 according to an example embodiment.

FIG. 12 is a flowchart illustrating, by way of example, a data output method of a memory device 100 according to an example embodiment.

Referring to FIG. 12, the data output method of the memory device 100 may be performed as follows. Data read from the memory cell array MCA may be separated into a plurality of sub-data (S110). The CRC values for each of the separated data may be calculated (S120). The calculated CRC values may be ordered for multilevel transmission (S130). Data may be output in multilevel signaling method along with the ordered CRC value (S140).

In an example embodiment, the CRC encoding method may be determined according to the setting of the memory register. In an example embodiment, the multilevel signaling method may be a pulse amplitude modulation 4-level (PAM4) signaling method.

In an example embodiment, data may be separated into the first sub-data having MSB data corresponding to a plurality of burst lengths and the second sub-data having LSB data corresponding to a plurality of burst lengths according to the CRC encoding method.

In an example embodiment, the data may be separated into the first sub-data having MSB data and LSB data corresponding to a first burst length and the second sub-data having MSB data and LSB data corresponding to a second burst length according to the CRC encoding method.

In an example embodiment, data, data bus inversion data, and CRC values may be transmitted by a multilevel signaling method.

Figure 13:
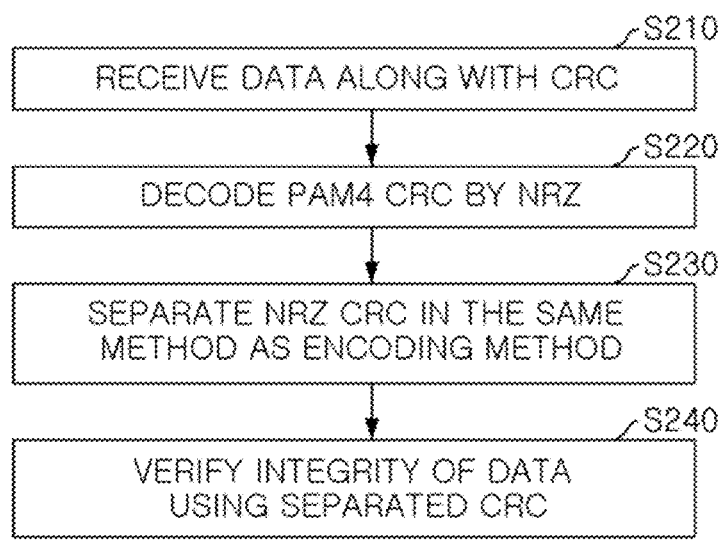
FIG. 13 is a flowchart illustrating, by way of example, a data receiving method of a controller 200 according to an example embodiment.

FIG. 13 is a diagram illustrating, by way of example, a data receiving method of a controller 200 according to an example embodiment.

Referring to FIG. 13, a method of receiving data of the controller 200 may be performed as follows. Data may be received along with the CRC by the PAM4 signaling method (S210). The PAM4 CRC may be decoded by an NRZ signaling method (S220). The NRZ CRC may be separated in the same manner as the encoding method (S230). The integrity of the transmitted data may be verified using the separated CRC value (S240).

FIGS. 1 to 13 describe a multilevel signaling method. Embodiments may be implemented by combining with the NRZ transmission signaling.

Figure 14A:
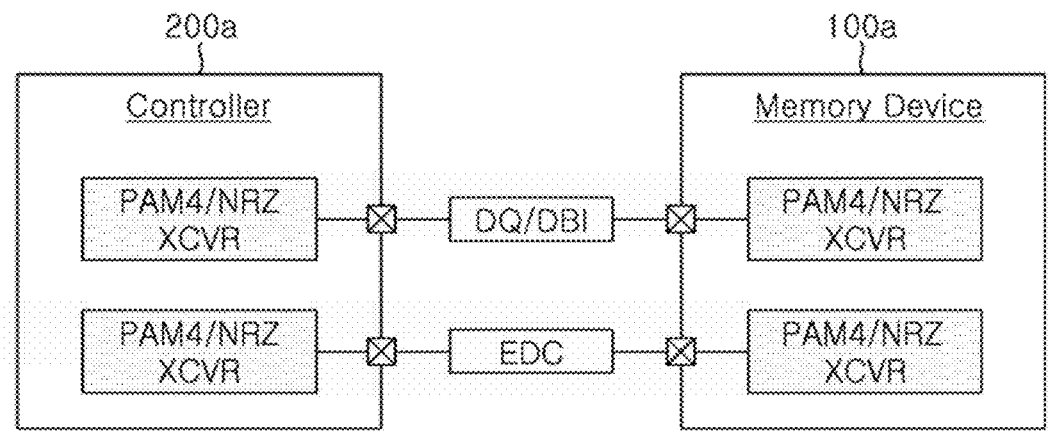
FIGS. 14A and 14B are diagrams illustrating, by way of example, memory systems according to PAM4 and NRZ dual-mode methods.
Figure 14B:
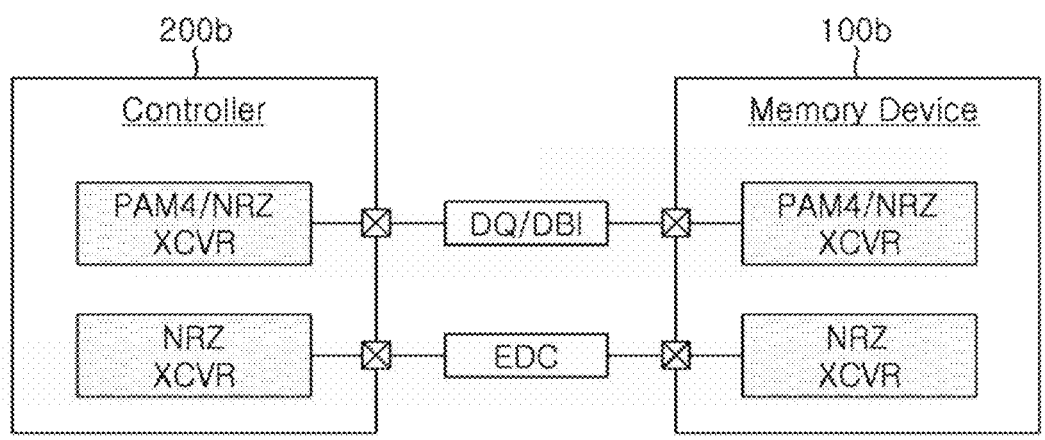

FIGS. 14A and 14B are diagrams illustrating, by way of example, memory systems according to PAM4 and NRZ dual-mode methods.

Referring to FIG. 14A, the memory system 20 may include dual-mode transceivers (PAM4/NRZ XCVR) for both DQ/DBI transmission and EDC transmission.

Referring to FIG. 14B, the memory system 30 may include a PAM4/NRZ dual-mode transceiver (PAM4/NRZ XCVR) for DQ/DBI transmission, and an NRZ transceiver (NRZ XCVR) for EDC transmission. For the EDC transmission, the CRC values may be calculated in parallel, and the NRZ transceiver (NRZ XCVR) may transmit the calculated CRC values by the NRZ method.

Figure 15:
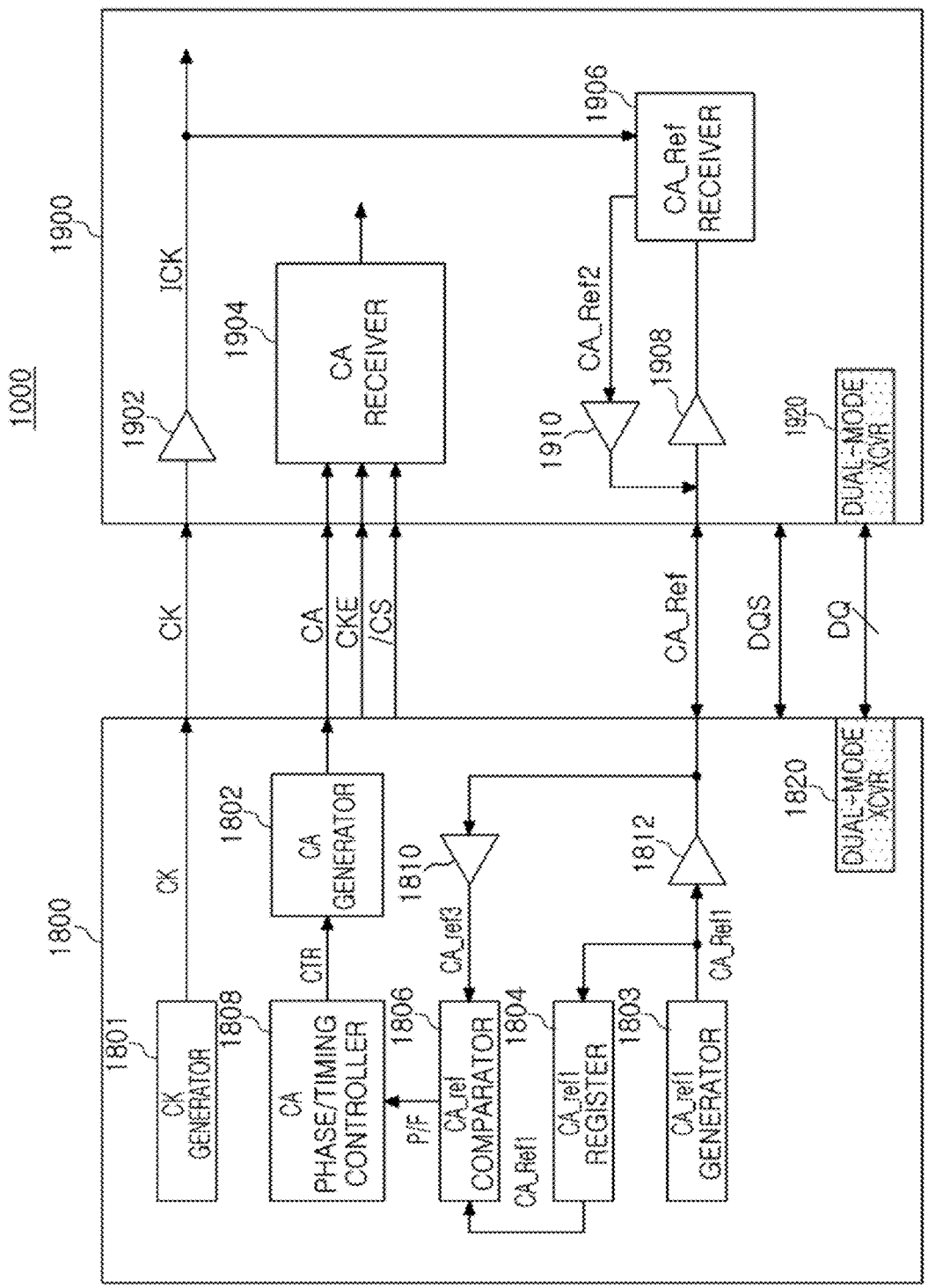
FIG. 15 is a diagram illustrating a memory system that performs at least one command/address calibration according to an example embodiment.

FIG. 15 is a diagram illustrating, by way of example, a memory system that performs at least one command/address calibration according to an example embodiment.

Referring to FIG. 15, a memory system 1000 may include a controller 1800 and a memory device 1900. The controller 1800 may include a clock generator 1801, a command/address (CA) generator 1802, a command/address reference generator 1803, a register 1804, a comparator 1806, a phase/timing controller 1808, and a data input device 1810 and a data output device 1812.

The controller 1800 may provide a clock signal CK generated by the clock generator 1801 to the memory device 1900 through a clock signal line.

In an example embodiment, the memory system 1000 may separately include a command/address reference signal line CA_Ref in the interface. The command/address reference signal line CA_Ref may serve to transmit and receive a command/address reference signal, which is a reference value of the command/address, in a calibration mode.

A calibration result value using the reference value of the command/address may be provided to a phase/timing controller 1808 to adjust the phase/timing of the command/address signal CA. Since there is a separate command/address reference signal line (CA_Ref), there is an advantage of performing a calibration operation of adjusting the phase/timing of the command/address (CA) signal while performing the operation of transmitting the command/address (CA) signal.

The CA generator 1802 may generate the command/address signal CA whose phase or timing is adjusted in response to a control signal CTR of the phase/timing controller 1808, and transmit the generated command/address signal CA to the memory device 1900 through the CA bus.

The command/address reference generator 1803 may be configured in the same manner as the command/address generator 1802, and may generate a first command/address reference signal CA_Ref1 identical to the command/address signal CA generated from the command/address generator 1802.

The first command/address reference signal CA_Ref1 may be provided to the register 1804. In addition, the first command/address reference signal CA_Ref1 may be transmitted to the CA reference bus through the data output device 1812 and may be provided to the memory device 1900 through the CA reference bus 16.

The register 1804 may store the first command/address reference signal CA_Ref1. The comparator 1806 may compare the first command/address reference signal CA_Ref1 stored in the register 1804 with a third command/address reference signal CA_Ref3 output from the data input device 1810. The comparator 1806 may generate a pass or fail signal P/F by comparing data of the first command/address reference signal CA_Ref1 and the third command/address reference signal CA_Ref3.

The phase/timing controller 1808 may generate a control signal CTR indicating a phase shift of the command/address signal CA according to the pass or fail signal P/F of the comparator 1806. The control signal CTR may generate the phase-adjusted command/address signal CA by adjusting the phase or timing of the command/address signal CA.

The data input device 1810 may receive a second command/address reference signal CA_Ref2 transmitted from the memory device 1900 through the CA reference bus and transmit the received command/address reference signal CA_Ref2 to the comparator 1806 as the third command/address reference signal CA_Ref3.

The data output device 1812 may receive the first command/address reference signal CA_Ref1 generated by the command/address reference generator 1803 and transmit the received first command/address reference signal CA_Ref1 to the CA reference bus CA_Ref.

The memory device 1900 may include a clock buffer 1902, a command/address (CA) receiver 1904, a command/address reference receiver 1906, and a data input device 1908 and a data output device 1910.

The clock buffer 1902 may generate an internal clock signal ICK by receiving the clock signal CK transmitted through the clock signal line. The CA receiver 1904 may receive a chip select signal/CS, a clock enable signal CKE, and a command/address signal CA transmitted through the CA bus in response to the internal clock signal ICK.

The clock enable signal CKE may be used as a pseudo command acting as a read command of the command/address signal CA transmitted through the CA bus. The CA receiver 1904 may receive the command/address signal CA when the clock enable signal CKE is activated.

The data input device 1908 may receive the first command/address reference signal CA_Ref1 transmitted through the CA reference bus from the controller 1800, and may transmit the received first command/address reference signal CA_Ref1 to the command/address reference receiver 1906. The command/address reference receiver 1906 may be configured in the same manner as the CA receiver 1904. The command/address reference receiver 1906 may receive the chip select signal/CS, the clock enable signal CKE, and the first command/address reference signal CA_Ref1 transmitted through the CA reference bus in response to the internal clock signal ICK, and may generate the second command/address reference signal CA_Ref2.

The second command/address reference signal CA_Ref2 may be the same as a signal output from the CA receiver 1904 that receives the chip select signal/CS, the clock enable signal CKE, and the command/address signal CA transmitted through the CA bus in response to the internal clock signal ICK. The second command/address reference signal CA_Ref2 may be transmitted to the CA reference bus through the data output device 1910.

The CA calibration performed in the memory system 1000 may be as follows. The CA generator 1802 of the controller 1800 may generate the command/address signal CA whose phase or timing is adjusted in response to the control signal CTR of the phase/timing controller 1808, and may transmit the generated command/address signal CA to the memory device 1900 to the CA bus. The command/address reference generator 1803 may generate the same first command/address reference signal CA_Ref1 as the command/address signal CA, and may transmit the generated first command/address reference signal CA_Ref1 to the CA reference bus.

The CA reference receiver 1906 of the memory device 1900 may receive the first command/address reference signal CA_Ref1 according to the internal clock signal ICK and the clock enable signal CKE, and may generate the second command/address reference signal CA_Ref2. The second command/address reference signal CA_Ref2 of the memory device 1900 may be transmitted to the CA reference bus.

The controller 1800 may transmit the second command/address reference signal CA_Ref2 transmitted through the CA reference bus to the comparator 1806 as the second command/address reference signal CA_Ref2. The comparator 1806 may generate a pass or fail signal P/F by comparing data of the first command/address reference signal CA_Ref1 and the second command/address reference signal CA_Ref2. The phase/timing controller 1808 may generate a control signal CTR indicating a phase shift of the command/address signal CA according to the pass or fail signal P/F of the comparator 1806. The CA generator 1802 may generate the command/address signal CA whose phase is adjusted according to the control signal CTR.

By repeating this CA calibration operation, the phase/timing controller 1808 of the controller 1800 may determine the middle of the passed (P) positions as the middle of the command/address signal CA window, and generate the command/address signal CA so that the middle of the command/address signal (CA) window comes to the edge of the clock signal (CK) and provide the generated command/address signal CA to the memory device 1900. Accordingly, the memory device 1900 may receive the command/address signal CA, in which the middle of the effective window is located at a rising/falling edge of a clock signal pair CK and CKB, at a rising/falling edge of the clock signal CK.

The memory system 1000 according to the present example embodiment may include dual-mode transceivers 1820 and 1920 described in FIGS. 1 to 14B in each of the controller 1800 and the memory device 1900.

In an example embodiment, each of the dual-mode transceivers 1820 and 1920 may select either an NRZ mode or a PAM4 mode through a plurality of data channels (DQ) in real time, and transmit data in the selected mode.

A memory device according to an example embodiment may be applied to a computing system.

Figure 16:
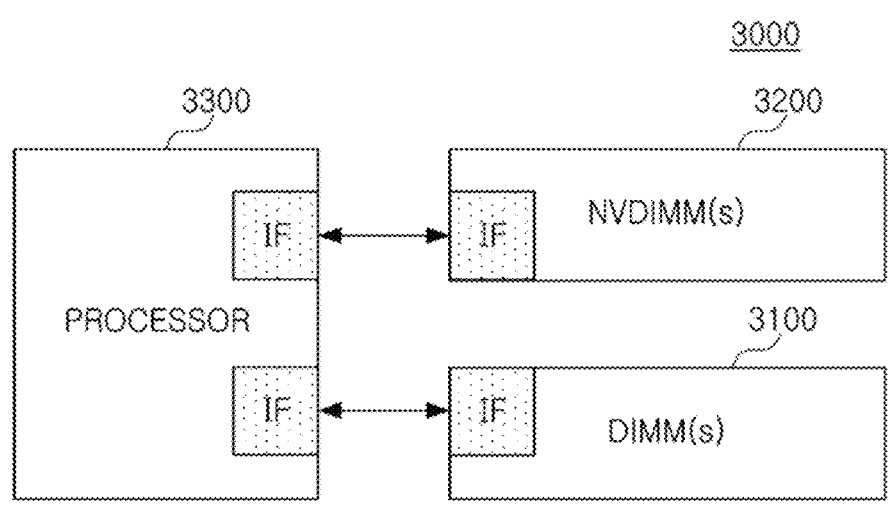
FIG. 16 is a diagram illustrating, by way of example, a computing system 3000 according to an example embodiment.

FIG. 16 is a diagram illustrating, by way of example, a computing system 3000 according to an example embodiment.

Referring to FIG. 16, the computing system 3000 includes at least one volatile memory module (DIMM(s)) 3100, at least one nonvolatile memory module (NVDIMM(s)) 3200, and at least one central processing unit (CPU(s)) 3300.

The computing system 3000 may be implemented as a computer, a portable computer, an ultra mobile PC (UMPC), a workstation, a data server, a netbook, a personal digital assistant (PDA), a tablet, a wireless phone, a mobile phone, a smartphone, an e-book, a portable multimedia player (PMP), a digital camera, a digital audio recorder/player, a digital camera/video recorder/player, a portable game machine, a navigation system, a block box, a wearable device, a 3D television, a device that receives and transmits information in a wireless environment, one of various electronic devices constituting a home network, one of various electronic devices constituting a computer network, one of various electronic devices constituting a telematics network, radio frequency identification (RFID), or one of various electronic devices constituting the computing system.

At least one nonvolatile memory module 3200 may include at least one nonvolatile memory. In an example embodiment, the at least one nonvolatile memory may include a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), a thyristor random access memory (TRAM), and the like.

In an example embodiment, at least one of the volatile memory module 3100 and the nonvolatile memory module 3200 may include an interface circuit IF that transmits the CRC value described in FIGS. 1 to 14B in multilevel signaling method and performs data communication with the processor 3300.

In an example embodiment, the volatile memory module 3100 and the nonvolatile memory module 3200 may be connected to the processor 3300 according to a DDRx (x is an integer greater than or equal to 1) interface.

At least one processor 3300 may be implemented to control the volatile memory module 3100 and the nonvolatile memory module 3200. In an example embodiment, the processor 3300 may include a general-purpose microprocessor, a multi-core processor, a digital signal processor (DSP), an application specific integrated circuit (ASIC), or a combination thereof.

A method of changing a transmission signaling mode according to an example embodiment may be performed inside a stacked memory package chip.

Figure 17:
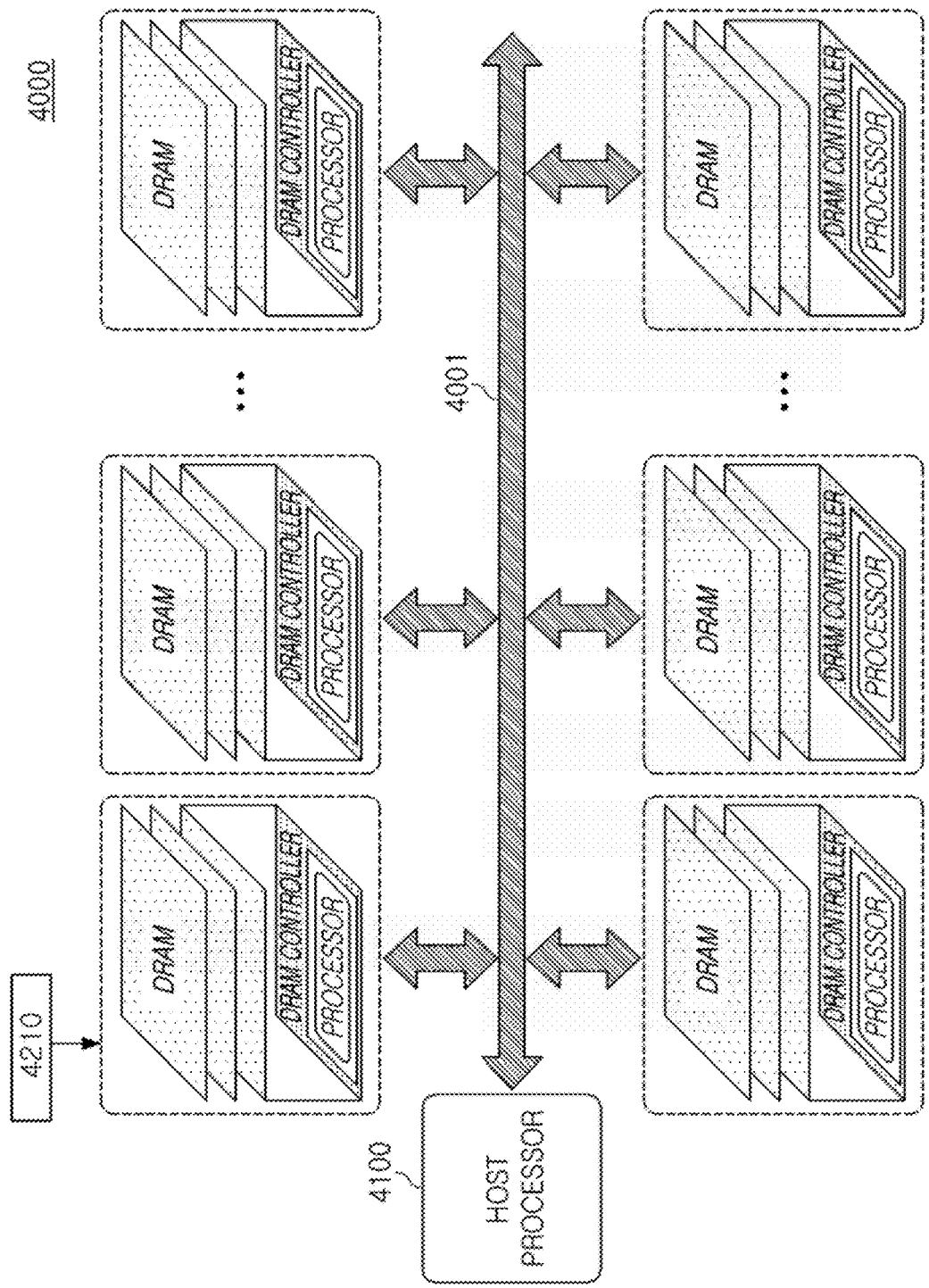
FIG. 17 is a diagram illustrating, by way of example, a computing system 4000 according to another example embodiment.

FIG. 17 is a diagram illustrating, by way of example, a computing system 4000 according to another example embodiment.

Referring to FIG. 17, the computing system 4000 may include a host processor 4100 and at least one memory package chip 4210 controlled by the host processor 4100.

In an example embodiment, the host processor 4100 and the memory package chip 4210 may transmit and receive data through a channel 4001.

The memory package chip 4210 may be a stacked memory package chip that includes stacked memory chips and a controller chip. Referring to FIG. 17, the memory package chip 4210 may include a plurality of DRAM chips formed on a DRAM controller chip. It should be understood that the configuration of the memory package chip is not limited thereto.

In an example embodiment, the transmission signaling between the stacked memory chips of the memory package chip 4210 and the controller chip may calculate the CRC by mapping cell data to the input of the parallel CRC calculator according to the setting of the memory register, and may order the outputs of the parallel CRC calculator and transmit the ordered outputs in the multilevel, as described in connection with FIGS. 1 to 14A.

A data communication method according to an example embodiment may be applied to a data center.

Figure 18:
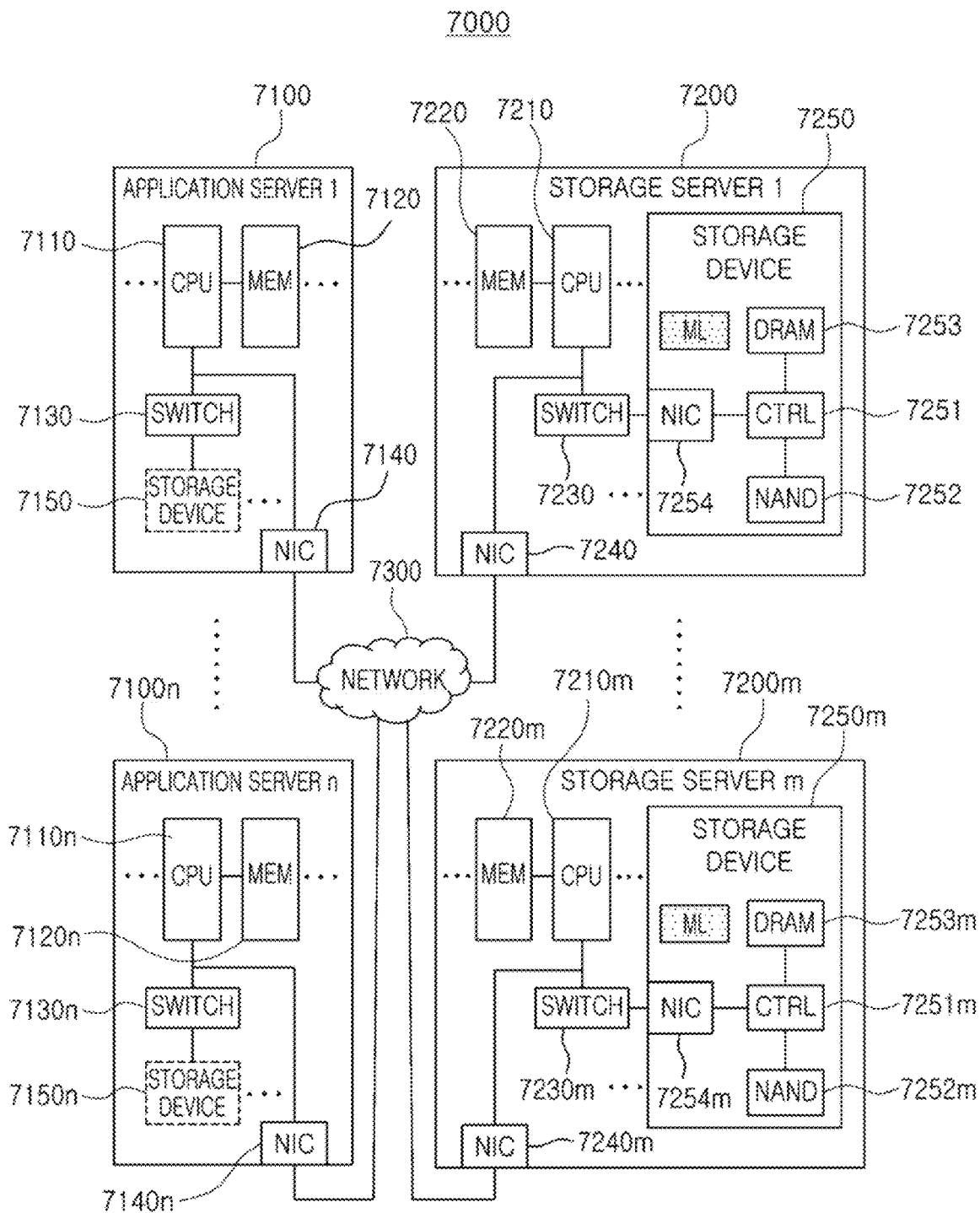
FIG. 18 is a diagram illustrating, by way of example, a data center to which the memory device according to the present example embodiment is applied.

FIG. 18 is a diagram illustrating, by way of example, a data center to which the memory device according to an example embodiment is applied.

Referring to FIG. 18, the data center 7000 may be a facility that collects various types of data and provides services, and may be referred to as a data storage center. The data center 7000 may be a system for operating a search engine and a database, and may be a computing system used by a company such as a bank or a government institution. The data center 7000 may include application servers 7100 to 7100n and storage servers 7200 to 7200m. The number of application servers 7100 to 7100n and the number of storage servers 7200 to 7200m may be variously selected according to example embodiments, and the number of application servers 7100 to 7100n and the number of storage servers 7200 to 7200m may be different.

The application server 7100 or the storage server 7200 may include at least one of processors 7110 and 7210 and memories 7120 and 7220.

Describing the storage server 7200 by way of example, the processor 7210 may control the overall operation of the storage server 7200, and access the memory 7220 and execute commands or data loaded in the memory 7220. The memory 7220 may be a double data rate synchronous DRAM (DDR SDRAM), a high bandwidth memory (HBM), a hybrid memory cube (HMC), a dual in-line memory module (DIMM), an Optane DIMM, or a non-volatile DIMM (NVMDIMM). According to the example embodiment, the number of processors 7210 and the number of memories 7220 included in the storage server 7200 may be variously selected.

In an example embodiment, the processor 7210 and the memory 7220 may provide a processor-memory pair. In an example embodiment, the number of the processor 7210 and the memory 7220 may be different from each other. The processor 7210 may include a single core processor or a multiple core processor. The description of the storage server 7200 may be similarly applied to the application server 7100. According to an example embodiment, the application server 7100 may not include a storage device 7150. The storage server 7200 may include at least one storage device 7250. The storage device 7250 may transmit the DQ/DBI data and the EDC data according to transmission signaling as described in FIGS. 1 to 17.

The application servers 7100 to 7100n and the storage servers 7200 to 7200m may communicate with each other through a network 7300. The network 7300 may be implemented using a fiber channel (FC), the Ethernet, or the like. The FC may be a medium used for relatively high-speed data transmission, and may use an optical switch providing high performance/high availability. Depending on the access method of the network 7300, the storage servers 7200 to 7200m may be provided as file storage, block storage, or object storage.

In an example embodiment, the network 7300 may be a storage-only network such as a storage area network (SAN). For example, the SAN may be an FC-SAN that uses an FC network and is implemented according to an FC protocol (FCP). As another example, the SAN may be an IP-SAN that uses a TCP/IP network and is implemented according to an SCSI over TCP/IP or Internet SCSI (iSCSI) protocol. In another example embodiment, the network 7300 may be a general network such as a TCP/IP network. For example, the network 7300 may be implemented according to protocols such as FC over Ethernet (FCoE), network attached storage (NAS), and NVMe over Fabrics (NVMe-oF).

In the following, description will be made focusing on the application server 7100 and the storage server 7200. The description of the application server 7100 may be applied to the other application server 7100*n*, and the description of the storage server 7200 may be applied to the other storage server 7200*m*.

The application server 7100 may store data requested to be stored by a user or a client in one of the storage servers 7200 to 7200*m* through the network 7300. The application server 7100 may acquire data requested to be read by a user or a client from one of the storage servers 7200 to 7200*m* through the network 7300. For example, the application server 7100 may be implemented as a web server, a database management system (DBMS), or the like.

The application server 7100 may access a memory 7120*n* or a storage device 7150*n* included in the other application server 7100*n* through the network 7300, or access memories 7220 to 7220*m* or storage devices 7250 to 7250*m* included in the storage servers 7200 to 7200*m* through the network 7300. The application server 7100 may perform various operations on data stored in the application servers 7100 to 7100*n* or the storage servers 7200 to 7200*m*. For example, the application server 7100 may execute a command for moving or copying data between the application servers 7100 to 7100*n* or the storage servers 7200 to 7200*m*. In this case, the data may move from the storage devices 7250 to 7250*m* of the storage servers 7200 to 7200*m* to the memories 7120 to 7120*n* of the application servers 7100 to 7100*n* through the memories 7220 to 7220*m* of the storage servers 7200 to 7200*m* or directly. The data moving through the network 7300 may be encrypted data for security or privacy.

Further describing the storage server 7200 by way of example, an interface 7254 may provide a physical connection between the processor 7210 and a controller 7251 and a physical connection between an NIC 7240 and a controller 7251. For example, the interface 7254 may be implemented in a direct attached storage (DAS) method in which the storage device 7250 is directly connected with a dedicated cable. As another example, the interface 7254 may be implemented in various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, a universal serial bus (USB), a secure digital (SD) card, a multi-media card (MMC), an embedded multi-media card (eMMC), universal flash storage (UFS), embedded universal flash storage (eUFS), and a compact flash (CF) card interface.

The storage server 7200 may further include a switch 7230 and the NIC 7240. The switch 7230 may selectively connect the processor 7210 and the storage device 7250, or may selectively connect the NIC 7240 and the storage device 7250 under the control of the processor 7210.

In an example embodiment, the NIC 7240 may include a network interface card, a network adapter, or the like. The NIC 7240 may be connected to the network 7300 by a wired interface, a wireless interface, a Bluetooth interface, an optical interface, or the like. The NIC 7240 may include an internal memory, a DSP, a host bus interface, and the like, and may be connected to the processor 7210 or the switch 7230 through a host bus interface. The host bus interface may be implemented as one of the examples of the interface 7254 described above. In an example embodiment, the NIC 7240 may be integrated with at least one of the processor 7210, the switch 7230, and the storage device 7250.

In the storage servers 7200 to 7200*m* or the application servers 7100 to 7100*n*, the processor may transmit a command to the storage devices 7130 to 7130*n* and 7250 to 7250*m* or the memories 7120 to 7120*n* and 7220 to 7220*m* to program or read data. In this case, the data may be data that is error-corrected through an error correction code (ECC) engine. The data may be data that is processed by data bus inversion (DBI) or data masking (DM), and may include cyclic redundancy code (CRC) information. The data may be encrypted data for security or privacy.

The storage devices 7150 to 7150*m* and 7250 to 7250*m* may transmit a control signal and a command/address signal to NAND flash memory devices 7252 to 7252*m* in response to a read command received from the processor. Accordingly, when data is read from the NAND flash memory devices 7252 to 7252*m*, a read enable (RE) signal may be input as a data output control signal and output data to the DQ bus. Data strobe (DQS) may be generated by using a RE signal. The command and address signals may be latched in the page buffer according to the rising or falling edge of the write enable (WE) signal.

The controller 7251 may control a general operation of the storage device 7250. In an example embodiment, the controller 7251 may include a static random access memory (SRAM). The controller 7251 may write data to the NAND flash memory device 7252 in response to a write command, or read data from the NAND flash memory device 7252 in response to a read command. For example, the write command or the read command may be provided from the processor 7210 in the storage server 7200, the processor 7210*m* in another storage server 7200*m*, or the processors 7110 and 7110*n* in the application servers 7100 and 7100*n*. The DRAM 7253 may temporarily store (buffer) data to be written to the NAND flash memory device 7252 or data read from the NAND flash memory device 7252. The DRAM 7253 may store meta data. The meta data may be user data or data generated by the controller 7251 to manage the NAND flash memory device 7252. The storage device 7250 may include a secure element (SE) for security or privacy.

As described above, a memory device (e.g., a DRAM) according to an example embodiment may separate cell data into a data selector according to a set value of a memory register, may map the separated cell data to the input of the sub-CRC calculator, and may calculate the CRC in parallel.

In an example embodiment, the memory device may map the output of a parallel CRC calculator to a PAM4 transmitter according to the set value of the memory register, and may generate the mapped output as the PAM4 CRC. In an example embodiment, an output of a first sub-block may be used as the MSB of a PAM4 Tx Pre-driver, and an output of a second sub-block may be used as the LSB of the PAM4 Tx Pre-driver (MSB/LSB separation method).

In an example embodiment, the mapping may be performed so that a CRC result of a first half BL data is transmitted first, and the CRC result of a second half BL data is then transmitted to the PAM4 output. Thus, the system may start the CRC decoding 2CLK earlier than the above-described MSB/LSB separation method.

A CRC encoding method and system for error check of multilevel data (PAM4) according to an example embodiment may include a CRC calculator, a CRC MUX including a CRC ordering circuit, and a PAM4 transmitter, and may maintain an error check rate by using a same polynomial while having the same CRC calculation speed, even if the number of data bits increases.

The presence or absence of an error may be checked after calculating the CRC through the calculation equation according to the data and polynomial. In this case, when a multilevel I/O interface is used, a number of data bits may increase compared to binary data, and as a result, a CRC calculation time may increase.

According to example embodiments, the memory device, the data output method thereof, and the memory system having the same may use CRC calculators that receive parallel data and have the same latency arranged in parallel, and the output of the parallel CRC calculator may be multiplexed with PAM4 Tx to output a double CRC code at the same time.

According to example embodiments, the memory device, the data output method thereof, and the memory system having the same may separate data into sub-data, calculate CRC values corresponding to the separated sub-data, order the calculated CRC values, and transmit the ordered calculated CRC values in multilevel signaling method, which may reduce the latency of the CRC encoding while maintaining the code rate and improving the system performance as much.

By way of summation and review, a signal modulation method based on non-return-to-zero (NRZ) type encoding may be difficult to implement under conditions of high data capacity and high-speed data transmission. A pulse amplitude modulation 4-level (PAM4) method may be used as a signal method for high-capacity and high-speed data transmission.

As described above, example embodiments provide a memory device that reduces CRC latency while maintaining a code rate when transmitting multilevel data, a data output method thereof, and a memory system having the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
    a memory cell array;
    a data selector configured to receive data from the memory cell array, and to output the received data as first sub-data and second sub-data;
    a cyclic redundancy check (CRC) generator configured to generate first CRC values corresponding to the first sub-data, and to generate second CRC values corresponding to the second sub-data;
    a CRC selector configured to determine an order of the first CRC values and the second CRC values, and to output one of the first CRC values and one of the second CRC values according to the determined order; and
    a transmitter configured to receive the first CRC values and the second CRC values according to the determined order, and to transmit CRC values of the data by a multilevel signaling method.

2. The memory device as claimed in claim 1, wherein:
    the first sub-data is most significant bit (MSB) data corresponding to a plurality of burst lengths, and
    the second sub-data is least significant bit (LSB) data corresponding to the plurality of burst lengths.

3. The memory device as claimed in claim 1, wherein:
    the first sub-data includes most significant bit (MSB) data and least significant bit (LSB) data corresponding to first half burst lengths, and
    the second sub-data includes MSB data and LSB data corresponding to second half burst lengths.

4. The memory device as claimed in claim 1, wherein the CRC generator includes:
    a first CRC calculator configured to receive one of the first sub-data and inverted first sub-data, and to calculate the first CRC values; and
    a second CRC calculator configured to receive one of the second sub-data and inverted second sub-data, and to calculate the second CRC values.

5. The memory device as claimed in claim 4, wherein the CRC generator further includes:
    a first DBI determiner configured to determine whether a data bus inversion is made based on the first sub-data, and to generate first DBI data;
    a first inverter configured to invert the first sub-data according to the first DBI data;
    a second DBI determiner configured to determine whether the data bus inversion is made based on the second sub-data, and to generate second DBI data; and
    a second inverter configured to invert the second sub-data according to the second DBI data.

6. The memory device as claimed in claim 1, wherein the CRC selector includes a CRC ordering circuit that determines the order of the first CRC values and the second CRC values.

7. The memory device as claimed in claim 1, wherein the transmitter includes:
    a most significant bit (MSB) driver configured to receive one of the first CRC values, and to transmit a corresponding MSB bit to an error detection check (EDC) pin; and
    a least significant bit (LSB) driver configured to receive one of the second CRC values, and to transmit a corresponding LSB bit to the EDC pin.

8. The memory device as claimed in claim 7, wherein the MSB driver includes:
    a plurality of pull-up transistors connected between a power terminal and the EDC pin; and
    a plurality of pull-down transistors connected between the EDC pin and a ground terminal.

9. The memory device as claimed in claim 8, wherein the LSB driver includes:
    a pull-up transistor connected between a power terminal and the EDC pin; and
    a pull-down transistor connected between the EDC pin and the ground terminal.

10. The memory device as claimed in claim 1, further comprising a memory register configured to store mode information for setting a CRC encoding mode of the data selector, the CRC generator, and the CRC selector.

11. A memory device, comprising:
    a memory cell array;
    a plurality of transceivers configured to transmit/receive data of the memory cell array through data lines by a multilevel signaling method;

a data bus inversion (DBI) transceiver configured to transmit/receive DBI data by the multilevel signaling method through a data bus inversion line; and a cyclic redundancy check (CRC) transceiver configured to transmit/receive CRC values of the data by the multilevel signaling method through an error detection check (EDC) line, wherein:

the memory device is configured to separate the data into a plurality of sub-data, generate the CRC values corresponding to each of the plurality of sub-data, and order the CRC values, and the CRC transceiver includes a transmitter configured to transmit the ordered CRC values by the multilevel signaling method.

12. The memory device as claimed in claim 11, wherein the multilevel signaling method is a pulse amplitude modulation 4-level (PAM4) signaling method.

13. The memory device as claimed in claim 11, further comprising an output device, wherein the separating of the data into the plurality of sub-data, the generating of the CRC values corresponding to each of the plurality of sub-data, and the ordering of the CRC values are performed by the output device.

14. The memory device as claimed in claim 13, wherein the output device includes:
   a plurality of CRC generators configured to generate the CRC values corresponding to the plurality of sub-data, respectively; and
   an ordering circuit configured to order the CRC values output from the plurality of CRC generators.

15. The memory device as claimed in claim 14, wherein at least one of the plurality of transceivers, the DBI transceiver, and the CRC transceiver is implemented with dual-mode signaling that selectively operates in non-return-to-zero (NRZ) signaling and PAM4 signaling.

16. A data output method of a memory device, the method comprising:

separating data that is read from a memory cell array into a plurality of sub-data;

calculating cyclic redundancy check (CRC) values corresponding to the plurality of sub-data, respectively;

ordering the calculated CRC values; and transmitting the ordered CRC values along with the data by a multilevel signaling method.

17. The method as claimed in claim 16, further comprising determining a CRC encoding method according to a setting of a memory register.

18. The method as claimed in claim 17, wherein:
the multilevel signaling method is a pulse amplitude modulation 4-level (PAM4) signaling method, and the separating includes separating the data into first sub-data having most significant bit (MSB) data corresponding to a plurality of burst lengths and a second sub-data having least significant bit (LSB) data corresponding to the plurality of burst lengths, according to the CRC encoding method.

19. The method as claimed in claim 17, wherein:
the multilevel signaling method is a pulse amplitude modulation 4-level (PAM4) signaling method, and the separating includes separating the data into first sub-data having most significant bit (MSB) data and least significant bit (LSB) data corresponding to first half burst lengths and second sub-data having MSB data and LSB data corresponding to second half burst lengths, according to the CRC encoding method.

20. The method as claimed in claim 16, wherein the transmitting includes:
transmitting the data by the multilevel signaling method;
transmitting data bus inversion data corresponding to the data by the multilevel signaling method; and
transmitting the ordered CRC values by the multilevel signaling method.

* * * * *